US012335649B1

(12) United States Patent
Mikkola et al.

(10) Patent No.: US 12,335,649 B1
(45) Date of Patent: Jun. 17, 2025

(54) METHODS AND SYSTEMS FOR SIGNAL SAMPLING USING SPATIAL DISPERSION AND PHOTONICS ASSISTANCE

(71) Applicant: Alphacore, Inc., Tempe, AZ (US)

(72) Inventors: Esko Olavi Mikkola, Mesa, AZ (US); Esen Salcin, Mesa, AZ (US)

(73) Assignee: ALPHACORE, INC., Tempe, AZ (US)

( * ) Notice: Subject to any disclaimer, the term of this patent is extended or adjusted under 35 U.S.C. 154(b) by 139 days.

(21) Appl. No.: 18/383,852

(22) Filed: Oct. 25, 2023

Related U.S. Application Data

(60) Provisional application No. 63/419,308, filed on Oct. 25, 2022.

(51) Int. Cl.
*H04N 25/772* (2023.01)
*H03M 1/12* (2006.01)
*H04N 25/779* (2023.01)
*H04N 25/78* (2023.01)

(52) U.S. Cl.
CPC ........ *H04N 25/772* (2023.01); *H03M 1/1255* (2013.01); *H04N 25/779* (2023.01); *H04N 25/78* (2023.01)

(58) Field of Classification Search
None
See application file for complete search history.

(56) References Cited

U.S. PATENT DOCUMENTS

| | | |
|---|---|---|
| 6,288,659 B1 | 9/2001 | Jalali et al. |
| 8,829,471 B1 | 9/2014 | Merkel et al. |
| 2012/0140236 A1 | 6/2012 | Babbitt et al. |
| 2018/0003560 A1 | 1/2018 | Asghari et al. |
| 2019/0219480 A1 | 7/2019 | Jalali et al. |
| 2019/0226989 A1 | 7/2019 | Karpf et al. |
| 2020/0311532 A1 | 10/2020 | Jalali et al. |
| 2021/0027589 A1* | 1/2021 | Mahmoud .......... G08B 13/1663 |

OTHER PUBLICATIONS

Asuri, Bhushan et al. "Time-Stretched ADC Arrays", IEEE Transactions on Circuits and Systems—II: Analoig and Digital Signal Processing, vol. 49, No. 7, Jul. 2002, pp. 521-524.
(Continued)

*Primary Examiner* — Mark T Monk
(74) *Attorney, Agent, or Firm* — LOZA & LOZA, LLP

(57) ABSTRACT

Methods and system for signal sampling using spatial dispersion are disclosed. In an example, a system includes a time-to-wavelength dispersion system configured to generate a wavelength dispersed optical pulse that is modulated according to an input signal, a wavelength-to-space dispersion system configured to spatially disperse the wavelength dispersed optical pulse by wavelength to produce a spatially dispersed optical pulse, a Fast Fourier Transform (FFT) optical system configured to transform the spatially dispersed optical pulse into a frequency domain transformed optical pulse, a sensor system configured to convert the frequency domain transformed optical pulse to electrical signals, the sensor system including a two-dimensional (2D) array of photodetectors, and a processor configured to determine frequency information about the input signal from the electrical signals.

8 Claims, 22 Drawing Sheets

(56) References Cited

OTHER PUBLICATIONS

Coppinger, F. et al. "Photonic Time Stretch and Its Application to Analog-to-Digital Conversion", IEEE Transactions On Microwave Theory And Techniques, vol. 47, No. 7, Jul. 1999, pp. 1309-1314.

Goda, K. et al. "Dispersive Fourier transformation for fast continuous single-shot measurements", Nature Fotonics, vol. 7, Feb. 2013, pp. 102-112.

Guo, Qiang et al. "Compressive sensing based high-speed timestretch optical microscopy for two-dimensional image acquisition", Optics Express, vol. 23, No. 23, Nov. 16, 2015, 8 pgs.

Guo, Zhen et al. "Ultimate Spatial Resolution Realisation in Optical Frequency Domain Reflectometry with Equal Frequency Resampling", Sensors 2021, vol. 21, No. 4632, Jul. 6, 2021, 12 pgs.

Hong, Brandon et al. "Channel dispersed Fourier transform spectrometer", Communications Physics 1, 34 (2018), Jul. 12, 2018, 8 pgs.

Mahjoubfar, Ata et al. "Time stretch and its applications", Nature Fotonics, vol. 11, Jun. 2017, pp. 341-351.

Valley, George C., "Photonic analog-to-digital converters", Optics Express 19555, vol. 15, No. 5, Mar. 2007, 28 pgs.

Wang, Wenshen et al. "Characterization of a Coherent Optical RF Channelizer Based on a Diffraction Grating", IEEE Transactions On Microwave Theory And Techniques, vol. 49, No. 10, Oct. 2001, pp. 1996-2001.

Wang, Chao, "Dispersive Fourier Transformation for Versatile Microwave Photonics Applications", Photonics 2014, Photonics, 1 (4). pp. 586-612.

Yang, Lei et al. "Photonic Time-Stretch Technology with Prismatic Pulse Dispersion towards Fast Real-Time Measurements", Photonics 2019, 6, 99, Sep. 9, 2019, 17 pgs.

Wenchao, Z. et al. "Ultrafast two-dimensional imaging for surface defects measurement of mirrors based on a virtually imaged phased-array", Optics Express, vol. 30, No. 21, published Sep. 26, 2022, pp. 37235-37244.

\* cited by examiner

Time-Wavelength-Space Mapping 660

| Time (Interval) | Wavelength (Range) | Space (2D Space On Image Sensor) |
|---|---|---|
| $t_1$-$t_{10}$ | $\lambda_1$-$\lambda_{10}$ | Area 1 ($X_1,Y_1$; $X_1,Y_2$; $X_2,Y_2$; $X_2,Y_1$) |
| $t_{11}$-$t_{20}$ | $\lambda_{11}$-$\lambda_{20}$ | Area 2 (XY Coordinates) |
| $t_{21}$-$t_{30}$ | $\lambda_{21}$-$\lambda_{30}$ | Area 3 (XY Coordinates) |
| ⋮ | ⋮ | ⋮ |
| $t_m$-$t_n$ | $\lambda_m$-$\lambda_n$ | Area P (XY Coordinates) |

FIG. 6B

Time-To-Wavelength-To-Space Mapping  662

| Time (Interval) | Wavelength (Range) | Space (2D Space On Image Sensor) |
|---|---|---|
| $t_1$-$t_{10}$ | $\lambda_1$-$\lambda_{10}$ | Area 1 (XY Coordinates) |
| $t_{11}$-$t_{20}$ | $\lambda_{11}$-$\lambda_{20}$ | Area 2 (XY Coordinates) |
| $t_{21}$-$t_{30}$ | $\lambda_{21}$-$\lambda_{30}$ | Area 3 (XY Coordinates) |
| ⋮ | ⋮ | ⋮ |
| $t_{91}$-$t_{100}$ | $\lambda_{91}$-$\lambda_{100}$ | Area 10 (XY Coordinates) |
| $t_{91}$-$t_{100}$ | $\lambda_{91}$-$\lambda_{100}$ | Area 11 (XY Coordinates) |
| ⋮ | ⋮ | ⋮ |
| $t_{191}$-$t_{200}$ | $\lambda_{191}$-$\lambda_{200}$ | Area 20 (XY Coordinates) |
| $t_{191}$-$t_{200}$ | $\lambda_{191}$-$\lambda_{200}$ | Area 21 (XY Coordinates) |
| ⋮ | ⋮ | ⋮ |
| $t_i$-$t_j$ | $\lambda_i$-$\lambda_j$ | Area P (XY Coordinates) |
| (Overlap In Time) | (Overlap In Wavelength) | |

FIG. 6D

METHODS AND SYSTEMS FOR SIGNAL SAMPLING USING SPATIAL DISPERSION AND PHOTONICS ASSISTANCE

CROSS-REFERENCE TO RELATED APPLICATION

This application claims priority to provisional U.S. Patent Application Ser. No. 63/419,308, filed Oct. 25, 2022, which is incorporated by reference herein.

BACKGROUND

Techniques for signal sampling, digitization, and/or frequency domain analysis typically involve all-electronic approaches in which an electrical signal that contains information of interest is sampled on to a capacitor with the use of specific electronic circuitry and then used in analog form or digitized with an analog-to-digital converter (ADC). Such all-electronic approaches can be limited by physical constraints of semiconductor based electronics, including, for example, parasitic resistance, capacitance, and inductance, high thermal noise, high jitter, and low linearity, all of which can limit the signal bandwidth and resolution.

Some techniques for signal sampling, digitization, and/or frequency domain analysis utilize photonics to effectively slow down the electronic signal of interest by stretching a modulated optical signal using optical elements and then digitizing the modulated optical signal with low-bandwidth ADCs. Although such known photonic-assisted techniques can achieve improvements in sampling rate, signal bandwidth, and resolution over all-electrical techniques, conventional photonic-assisted techniques tend to be expensive and have very large size and high-power consumption.

SUMMARY

Methods and system for signal sampling using spatial dispersion are disclosed. In an example, a system includes a time-to-wavelength dispersion system configured to generate a wavelength dispersed optical pulse that is modulated according to an input signal, a wavelength-to-space dispersion system configured to spatially disperse the wavelength dispersed optical pulse by wavelength to produce a spatially dispersed optical pulse, a Fast Fourier Transform (FFT) optical system configured to transform the spatially dispersed optical pulse into a frequency domain transformed optical pulse, a sensor system configured to convert the frequency domain transformed optical pulse to electrical signals, the sensor system including a two-dimensional (2D) array of photodetectors, and a processor configured to determine frequency information about the input signal from the electrical signals.

In an embodiment, the system includes a display for outputting the electrical signals as an image that conveys optical spectrum information.

In an embodiment, the processor is configured to decode the electrical signals from the sensor system in response to a wavelength-space mapping that corresponds to the spatial dispersion of the spatial dispersion system to determine the frequency information.

A method involves outputting a wavelength dispersed optical pulse that is modulated according to an input signal, spatially dispersing the wavelength dispersed optical pulse by wavelength to produce a spatially dispersed optical pulse, transforming the spatially dispersed optical pulse according to a FFT operation into a frequency domain transformed optical pulse, converting the frequency domain transformed optical pulse to electrical signals at a sensor system, the sensor system including a 2D array of photodetectors, and determining frequency information about the input signal from the electrical signals.

In an embodiment, determining the frequency information about the input signal involves decoding the electrical signals from the sensor system in response to a wavelength-space mapping that corresponds to the spatial dispersion of the spatial dispersion system.

In an embodiment, the method involves decoding the electrical signals from the image sensor to spectrum information of the input signal.

In an embodiment, the method involves outputting the electrical signals from the image sensor as an image.

In an embodiment, the input signal is an RF input signal.

Other aspects in accordance with the invention will become apparent from the following detailed description, taken in conjunction with the accompanying drawings, illustrated by way of example of the principles of the invention.

BRIEF DESCRIPTION OF THE DRAWINGS

FIG. 6B is an example of time-wavelength-space mapping that corresponds to the image sensor of FIG. 6A.

FIG. 6D is an example of time-wavelength-space mapping that corresponds to the image sensor of FIG. 6C.

Throughout the description, similar reference numbers may be used to identify similar elements.

DETAILED DESCRIPTION

Figure 1:
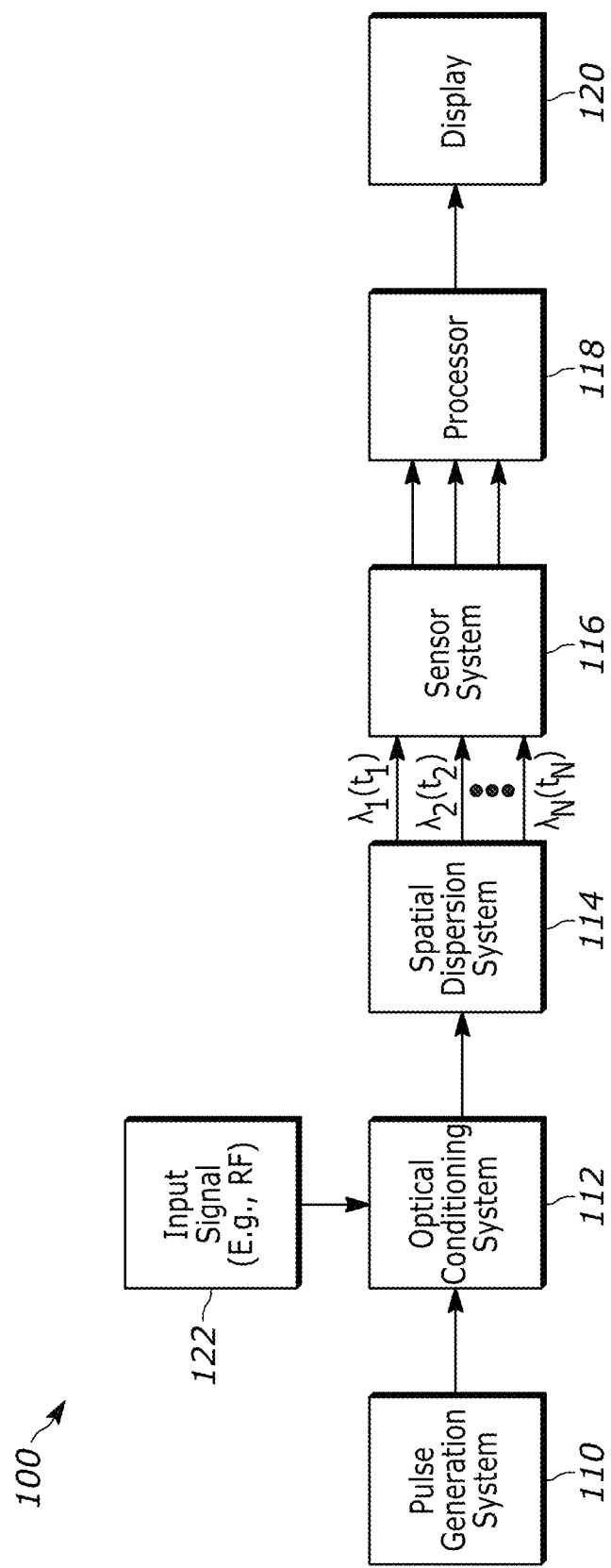
FIG. 1 is a high level depiction of a system for signal sampling using spatial dispersion.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

The current disclosure includes systems and methods based on a novel time-to-wavelength-to-space mapping technique suitable for electromagnetic signal sampling, storage, quantization, digitization domain analysis, and frequency domain analysis. In an example of the disclosed systems and methods, a light pulse (e.g., a carrier signal) is time stretched (e.g., time to wavelength translation) and then modulated with an electrical signal (e.g., a radio frequency (RF) signal) that contains information of interest (also referred to as a signal of interest or an input signal). The time-stretched and modulated light pulse is then processed by a light projection device (also referred to as a spatial dispersion system) that disperses the light pulse by wavelength onto different spatial positions of an image sensor (e.g., different positions over a 2D space) such that the different wavelengths are effectively mapped to the spatial domain. Different positions within the spatial domain can be locations on the image sensor, e.g., location in an array of photodetectors, such as array of photodetectors in the image sensor. After the photodetectors in the array of photodetectors convert the incoming light into electrical charge, the wavelength information in the light pulse is captured (e.g., sampled) in the spatial locations of the photodetector and held for further use (e.g., quantization, digitization, transfer to the next sub-system, signal analysis, etc.). In an embodiment, the light can be projected onto the surface of an optical device for optical data processing, such as optical fast Fourier transform (FFT).

In an example, an ultra-high sampling rate sample and hold circuit and/or a digitizer can be formed using the techniques disclosed herein when an electrical signal of interest is first superimposed into a chirped and elongated light pulse with an electro-optical modulator (and is thus time-to-wavelength converted), followed by a projection device that causes wavelength-to-spatial position mapping over an array of photodetectors that then captures the time information of the electrical signal of interest as stored electrical charge packets. As is described below, the positions of the photodetectors in the array (e.g., an image sensor with thousands of pixels) are directly related to the time instants of the electrical signal under analysis. The electrical signal of interest can then be converted back to the time domain (e.g., reconstructed) as a sampled or digitized electrical signal. A benefit of such an approach is that a high frequency signal can be sampled by thousands of parallel photodetector units (e.g., pixels), which provides a very high combined sampling rate that is far beyond what conventional electronic samplers and digitizers have achieved. Another benefit is the low-complexity of the system. For example, a standard CMOS image sensor can serve as the photodetector array of a sampling and digitizing sub-system after the wavelength-to-space mapping has been implemented by a wavelength dispersion system.

In other embodiments of the disclosed technique, the light pulse undergoes at least one optical or photonic signal processing stage (e.g., optical FFT) before the light pulse is incident on the photodetector array. A benefit of such a technique is that the electrical signal of interest can be processed in the optical and/or photonic domains before being sampled at the photodetector array, which can provide much faster processing capabilities than all-electronic processing techniques. The disclosed techniques can thus be used to form an analog-to-information converter that provides a direct path from an analog signal domain (typically analog RF) to the information of interest (e.g., time-series digital data and/or frequency spectrum) in a very short period of time and with low power and low cost.

FIG. 1 is a high level depiction of a system 100 for signal sampling using spatial dispersion. The system includes a pulse generation system 110, an optical conditioning system 112, a spatial dispersion system 114, a sensor system 116, a processor 118, and a display 120.

The pulse generation system 110 is configured to generate a pulse of electromagnetic energy in an electromagnetic energy spectrum referred to generally herein as "optical," as in an optical pulse, or an optical signal. As used herein, the term optical may include electromagnetic energy in the visible spectrum and/or in other spectrums including, for example, UV, infrared (IR), mid-wave IR (MWIR), and long-wave IR (LWIR) spectrums. In an example, the pulse generation system includes a mode-locked laser (MLL) that generates ultra-short broadband laser pulses.

The optical conditioning system 112 is configured to "stretch" the generated optical pulse in the time domain to separate different wavelengths of the optical pulse in time. For example, the optical conditioning system acts as a time-to-wavelength dispersion system that is configured to disperse the optical pulse by wavelength over time to produce a wavelength dispersed optical pulse. The optical conditioning system may include a chirping device, such as a dispersion compensating fiber (DCF) that spreads the different wavelengths of the optical pulse in time. For example, the optical conditioning system may stretch a laser pulse over 1 nanosecond. The optical conditioning system is also configured to modulate the wavelength dispersed optical pulse according to an input signal 122, such as a radio frequency (RF) signal that carries spectrum information and/or time-serial digital data and that is a signal of interest. For example, the input signal of interest is an electrical signal that was generated from an RF signal that was received on an antenna (not shown). In an example, the optical conditioning system includes an electro-optical modulator (EOM) or a Mach-Zehnder Modulator (MZM) that is configured to modulate the wavelength dispersed optical pulse according to the input signal (e.g., an RF signal of interest) although other elements may be used for modulation. Upon modulation, the optical conditioning system outputs a wavelength dispersed optical pulse, which has been modulated according to the input signal, also referred to as a modulated and wavelength dispersed optical pulse.

The spatial dispersion system 114 is configured to spatially disperse the modulated and wavelength dispersed optical pulse to produce a spatially dispersed optical pulse. In an example, the spatial dispersion system disperses the modulated and wavelength dispersed optical pulse over a two-dimensional (2D) space by wavelength. For example, the spatial dispersion system acts as a wavelength-to-space dispersion system that disperses the optical pulse by wavelength over a 2D space.

The sensor system 116 is configured to convert the spatially dispersed optical pulse to electrical signals. In an example, the sensor system includes a 2D array of photodetectors that are positioned with respect to the spatial dispersion system 114 to receive the modulated and wavelength dispersed optical pulse. In an embodiment, the sensor system may include a commercial off the shelf (COTS) complementary metal-oxide semiconductor (CMOS) image sensor, a charge-coupled device (CCD) array, or some other densely packed 2D array of photodetectors. The sensor system may also include a read-out integrated circuit (ROIC) that is able to readout out electrical signals from the 2D array of photodetectors and provide digital data to the processor.

The processor 118 is configured to decode electrical signals that are received from the sensor system 116 to identify some characteristic of the input signal (e.g., to decode digital data received from the sensor system into time-series digital data or to identify frequency spectrum information). In an example, the processor uses time-wavelength-space mapping that corresponds to the spatial dispersion of the dispersion system to decode digital data that is received from the sensor system. In an embodiment, the processor may include an integrated circuit device that includes processing cores that implement reduced instruction set computing (RISC) processing, advanced RISC machine (ARM) processor cores, microprocessor without interlocked pipeline stages (MIPS) processor cores, and/or x86 processor cores, as is known in the field. In an example, the processor includes memory to store a time-wavelength-space mapping as needed to decode received digital data.

The display 120 is configured to display information, for example, information about the input signal 122. In an embodiment, the display may display time-series data as digital data and/or spectrum information. Although a display is shown, the system 100 may not include a display and data produced by the processor 118 can be output to some other device such as a digital data storage device.

Figure 2A:
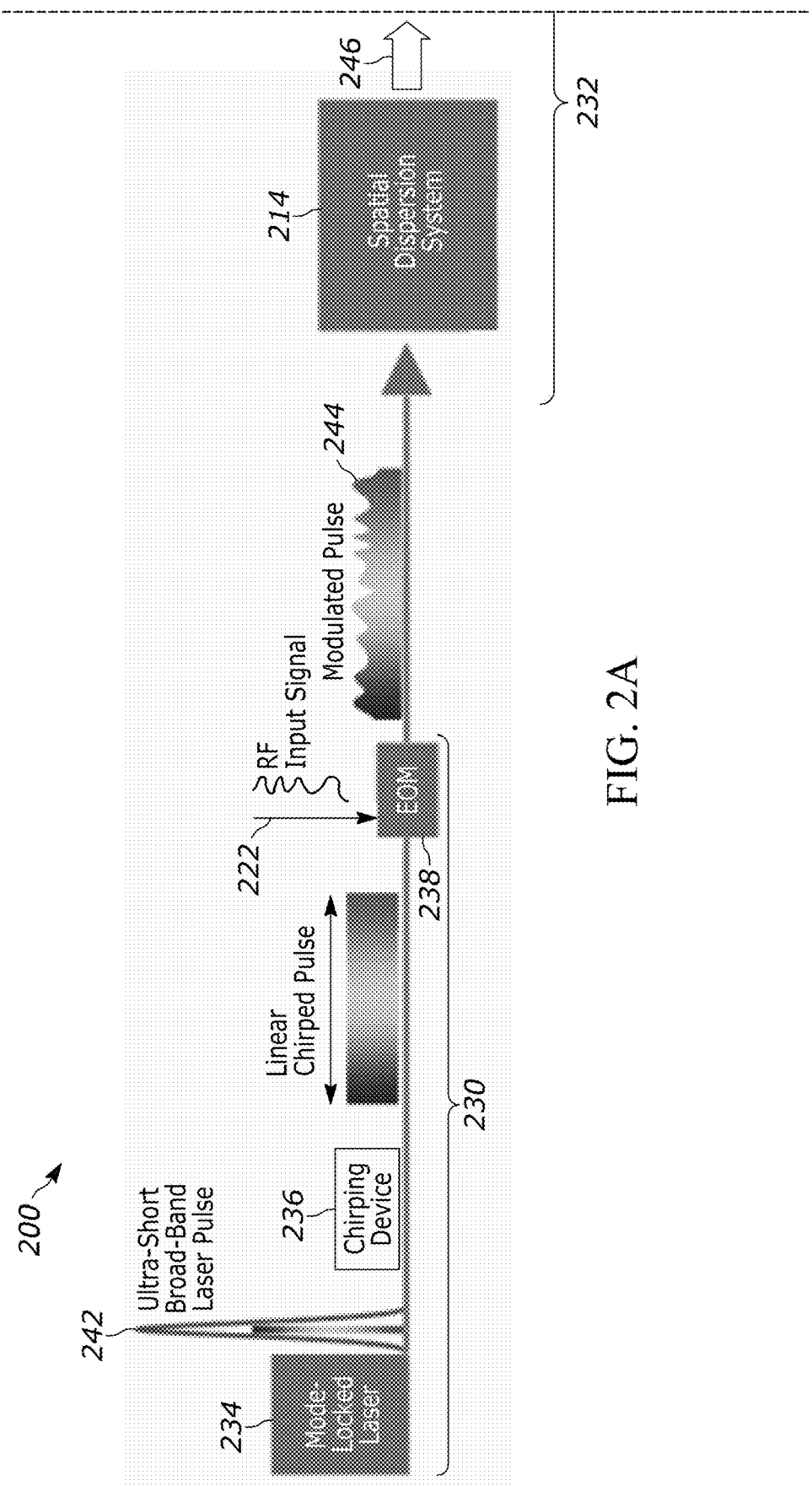
FIG. 2A illustrates an example of a photonic-assisted analog-to-digital converter (ADC) system that utilizes spatial dispersion.
Figure 2A:
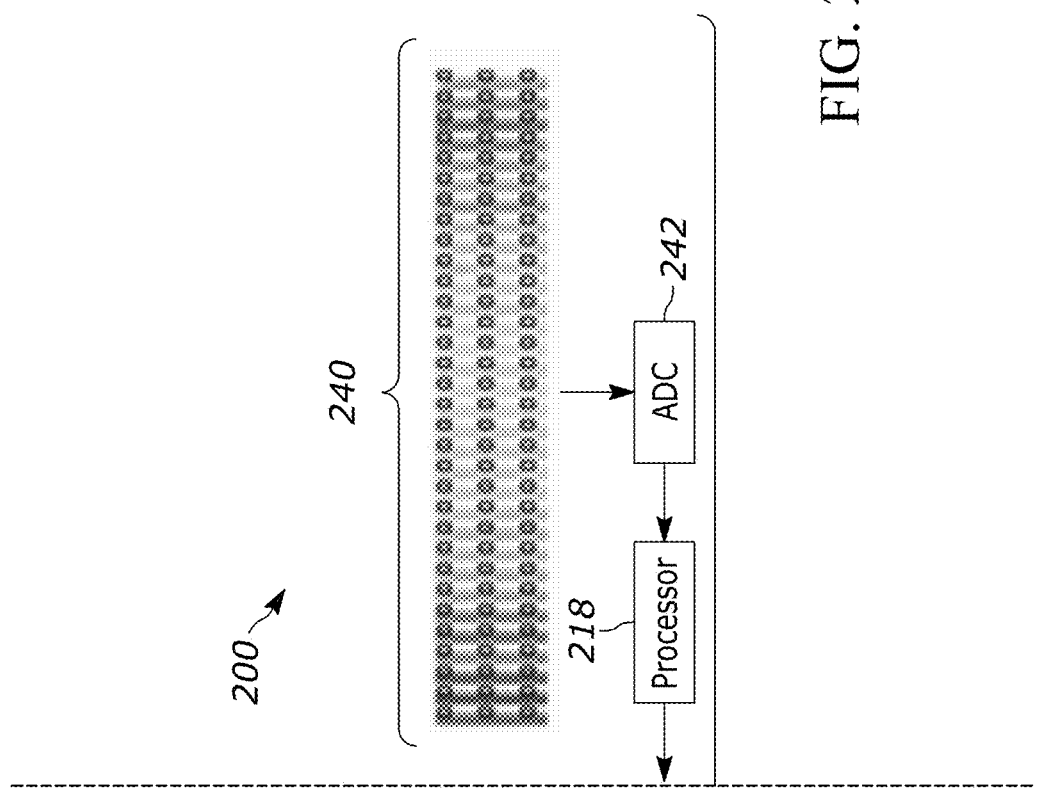

FIG. 2A illustrates an example of a photonic-assisted analog-to-digital converter (ADC) system 200 that includes a first portion 230 and a second portion 232. The first portion 230 of the system includes a mode-locked laser (MLL) 234, a chirping device 236, and an electro-optical modulator (EOM) 238 and is configured to output a wavelength dispersed optical pulse that is modulated according to an input signal. The second portion 232 of the system includes a spatial dispersion system 214, a 2D photodetector array 240, an analog-to-digital converter (ADC) 242, and a processor 218. The second portion is configured to spatially disperse the wavelength dispersed optical pulse by wavelength to produce a spatially dispersed optical pulse, to sample the electromagnetic energy of the spatially dispersed optical pulse over a 2D photodetector array, and to process resulting digital data to provide some useful information about the input signal.

Elements of the first portion 230 have been utilized in conventional photonic-assisted ADCs. With reference to FIG. 2A, the mode-locked laser 234 produces an ultra-short (in the time domain) optical pulse 242 that includes a broad range of wavelengths. For example, the optical pulse is related to the wavelength-spectrum of the pulse by a Fourier transform relationship: the shorter the pulse in time-domain, the broader the correspondence in the spectral bandwidth. In other words, more frequency components can be packed into a shorter pulse. In an embodiment, the mode-locked laser has a repetition rate varying from hundreds of kilohertz to a few hundred megahertz (MHz). The optical pulse enters the chirping device 236, which is a dispersive unit that generates an elongated optical pulse with unique wavelengths associated with each point in time during the pulse. That is, the chirping device disperses the optical pulse by wavelength over time, also referred to as a time-to-wavelength translation. The optical pulse is then modulated by the electro-optical modulator 238 according to an input signal, which is a signal of interest, such as an RF input signal that has been received on an antenna (or antennas) (not shown) and converted to an electrical signal. For example, the electro-optical modulator modulates the amplitude of the optical pulse according to the input signal. The resulting optical signal 244 is a wavelength dispersed optical pulse that is modulated according to an input signal 222 and as such includes consecutive time-instances of the input signal (e.g., an RF input signal) superimposed into the different wavelengths of the wavelength dispersed optical pulse. In an example, the different wavelengths of the wavelength dispersed optical pulse decrease from left to right.

In conventional photonic-assisted ADCs, the wavelength dispersed and modulated optical pulse may be detected by a single photodetector. However, the sampling rate of such a single photodetector is limited by the speed of the single photodetector. In other photonic-assisted ADCs, the wavelength dispersed and modulated optical pulse is dispersed in one dimension across a 1D row of photodetectors.

It has been realized that improved performance and cost reduction could be achieved by spatially dispersing the wavelength dispersed optical signal and detecting the spatially dispersed optical pulse on an image sensor, such as a low cost CMOS image sensor, according to a pre-established wavelength-to-space mapping. The pre-established wavelength-to-space mapping allows a feature of the input signal to be determined from the signals captured by the image sensor.

Referring again to FIG. 2A, the modulated and wavelength dispersed optical pulse 244 that has the wavelength separation is used in the disclosed approach as the input to the spatial dispersion system 214, also referred to as a light projection system. The signal sampling and digitization technique is implemented in the second portion 232 of the system 200 and includes the spatial dispersion system 214, which is used to spread the incoming modulated optical pulse onto the 2D array of photodetectors 240, also referred to herein as a 2D photodetector array, such as a CMOS image sensor device. The modulated and spatially dispersed optical pulse 246 is then sampled in the photodetector array as a form of electrical charge that can be read out in an analog format, or in digital format using an electronic ADC. The RF input signal of interest (e.g., the input signal) can be reconstructed from the charge values stored on the photodetector array. Typically, the charge values are measured as voltage values since charge stored on a capacitor forms voltage. Note that a typical commercial off the shelf (COTS) image sensor or a camera, both of which could be used in the disclosed system, contains ADCs that will convert the charge values stored on the 2D photodetector array into digital data.

Due to the fact that the spatial dispersion system disperses wavelengths onto different spatial positions on the 2D photodetector array, and the fact that the different wavelength bins in the modulated chirped optical pulse have different time instants of the RF input signal superimposed into it, the 2D photodetector array now holds sampled values of different time instants of the RF input signal of interest.

Affordable 2D photodetector arrays, such as CMOS, charge-coupled device (CCD), Germanium and InGaAs image sensors with millions of photodetectors (pixels) are readily commercially available. The techniques disclosed herein and corresponding 2D photodetector array are applicable to electromagnetic energy in, for example, the visible, UV, infrared (IR), mid-wave IR (MWIR), and long-wave IR (LWIR) spectrums. Using such as an image sensor array in photonic-assisted ADC provides a system that effectively has millions of capacitors storing different time instants of the RF input signal of interest (e.g., the input signal). Extremely high, unprecedented sampling rates can be achieved using the techniques disclosed herein.

In an embodiment, a system including the above-mentioned time-interleaved sample and hold circuit forms a time-interleaved digitizer or a time-interleaved analog to digital converter (ADC) when the sampled values (e.g., photo-induced charges stored in the capacitances of the photodetectors) are digitized within the 2D photodetector array or somewhere else in the system. The digitizer samples the input signal at a very high sampling rate onto the 2D photodetector array and then digitizes the samples at a lower rate using accurate but low speed electronic ADCs placed either in the 2D photodetector array or at another location in the system. Typical CMOS image sensors (sometimes referred to as "cameras") have electronic ADCs already included on the corresponding sensor integrated circuit (IC) device or "chip." Most types of commercial off the shelf (COTS) cameras have ADCs either on the sensor IC device or on the camera PCB board and provide data in the form of digital bits. Both an image sensor or a camera contain ADCs that can be used as building blocks of the system that is the subject of this disclosure. The image sensors or cameras used should be sensitive to the laser light wavelengths used.

Referring again to FIG. 2A, the processor 218 is configured to decode electrical signals that are received from the ADC 242 to identify some characteristic of the input signal (e.g., to decode the electrical signals into time-series digital data or to identify frequency spectrum information). In an example, the processor uses a time-wavelength-space mapping that corresponds to the spatial dispersion of the dispersion system to decode digital data that is received from the sensor system. In an example, the processor includes memory to store time-wavelength-space mapping as needed to decode received digital data.

Figure 2B:
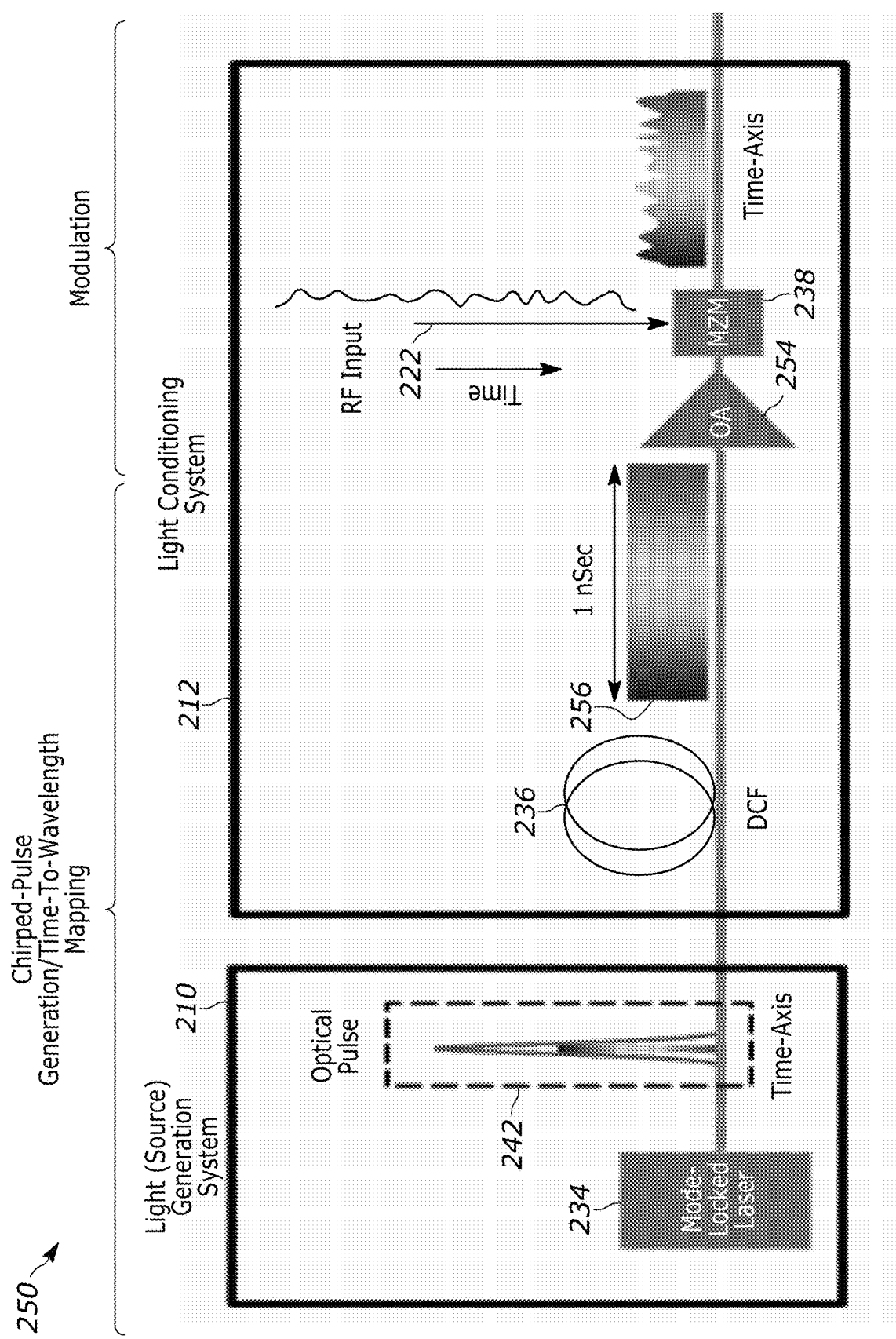
FIG. 2B illustrates another example of a photonic-assisted ADC system that utilizes spatial dispersion.
Figure 2B:
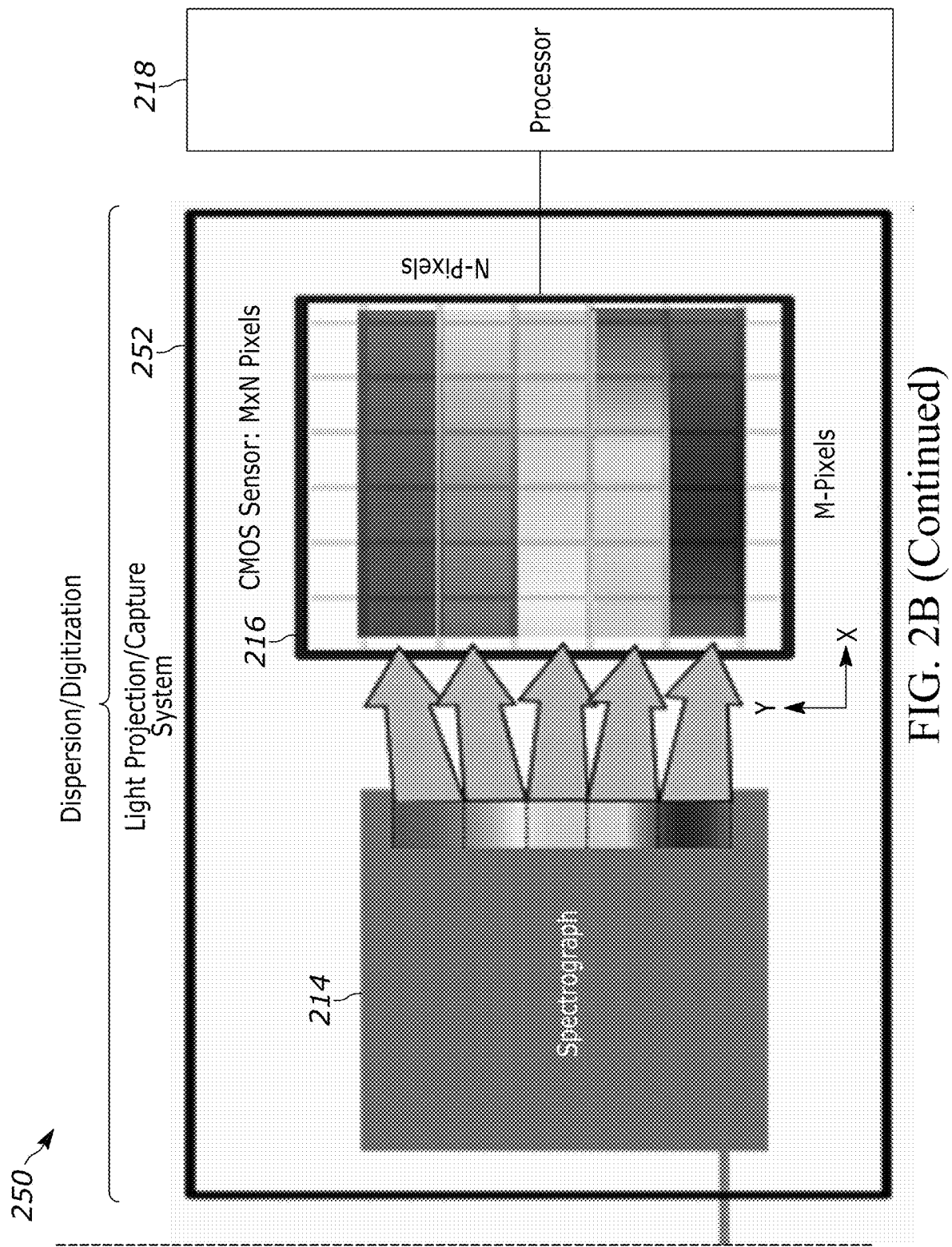

FIG. 2B illustrates another example of an embodiment of a signal sampling and digitization system 250 and technique based on spatial dispersion onto a 2D photodetector array, such as a CMOS image sensor. FIG. 2B provides further details on an example embodiment of the system disclosed herein. As shown in FIG. 2B, the system includes a light generation system 210, a light conditioning system 212, and a light projection/capture system 252. The light generation system includes a mode-locked laser 234 that produces an optical pulse 242, although other light generation systems are possible. The light conditioning system includes a dispersion compensating fiber (DCF) 236, an optical amplifier (OA) 254, and Mach-Zehnder Modulator (MZM) 238, although other components are possible. The optical pulse 242 from the light generation system is dispersed by wavelength by the dispersion compensated fiber and the input signal 222 (e.g., an RF input signal) is modulated onto the wavelength dispersed optical pulse. That is, as illustrated in FIG. 2B, the pulse stretching can be done with a dispersion compensating fiber (DCF), the pulse can then be amplified with an optical amplifier (OA), and the electromagnetic input signal (e.g., the RF input signal) can be encoded into wavelengths of the wavelength dispersed optical pulse via the Mach-Zehnder Modulator (MZM).

In an example, the light signal onto which the electronic signal of interest is modulated (e.g., superimposed) is a chirped and elongated optical pulse with a separate wavelength associated with each point in time during the pulse. A dispersion compensating fiber (DCF) is often used to generate these types of pulses since DCFs typically have a high dispersion factor per unit length and relatively low attenuation that is comparable to conventional optical fiber although other time stretching elements could be used. The chromatic dispersion of the DCF causes the different wavelengths of the optical pulse to travel at different speeds and the optical pulse to spread as it propagates down the fiber.

Another way to generate the modulated chirped light pulse is to use a continuum generator system and then a light pulse stretching medium, such as a dispersion compensating fiber. Yet another way to generate the optical pulse is to generate the different wavelengths in the optical pulse with an active device, such as a tunable vertical-cavity surface-emitting laser (VCSEL).

The above-mentioned system (e.g., the combination of light (source) generation system and portions of the light conditioning system in FIG. 2B) that includes the depicted components has been shown to be functional for time-to-wavelength translation (or mapping). In an embodiment, the methods and systems disclosed herein include some type of time to wavelength translator sub-system in order to function as an ultra-high sampling rate sample and hold system or a digitizer system.

Referring to FIG. 2B, the light projection/capture system 252 includes a spatial dispersion system 214 (also referred to as a light projection system or a spectrograph), an image sensor 216 (e.g., a CMOS sensor having M×N pixels), and a processor 218. As illustrated in FIG. 2B, the spectrograph spatially disperses the received signal by wavelength over a 2D array of photodetectors such as a CMOS sensor. In the example of FIG. 2B, different wavelengths are represented by different degrees of shading.

The processor 218 is configured to decode electrical signals that are received from the CMOS sensor 216 to identify some characteristic of the input signal (e.g., to decode time-series data or to identify frequency spectrum information). In an example, the processor uses a time-wavelength-space mapping that corresponds to the spatial dispersion of the spatial dispersion system to decode digital data that is received from the light projection/capture system. In an example, the processor includes memory to store time-wavelength-space mapping as needed to decode received digital data.

Figure 3A:
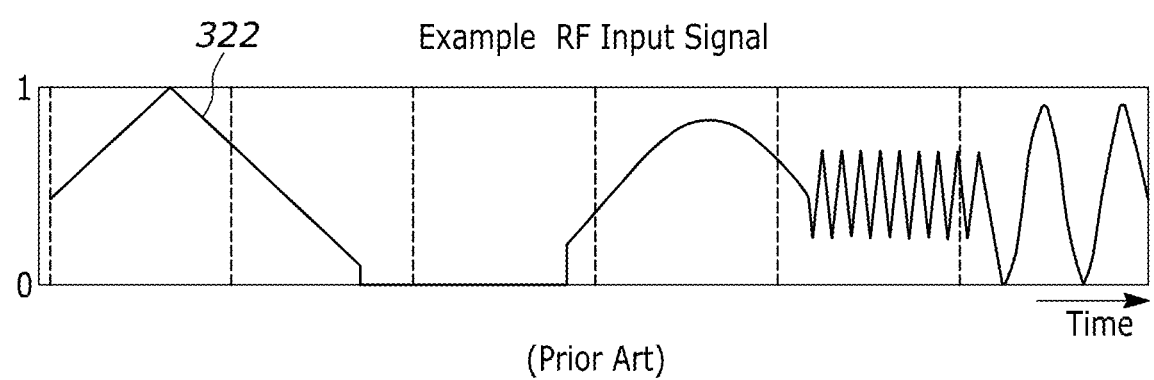
FIG. 3A depicts an example of an RF input signal that has been modulated onto a time-stretched optical pulse as a function of time.

FIG. 3A depicts an example of an RF input signal 322 that has been modulated onto a time-stretched optical pulse as a function of time. In the example of FIG. 3A, time increases from left to right, wavelength decreases from right to left, and the amplitude of the RF input signal fluctuates across time and wavelength between "0" and "1".

Figure 3B:
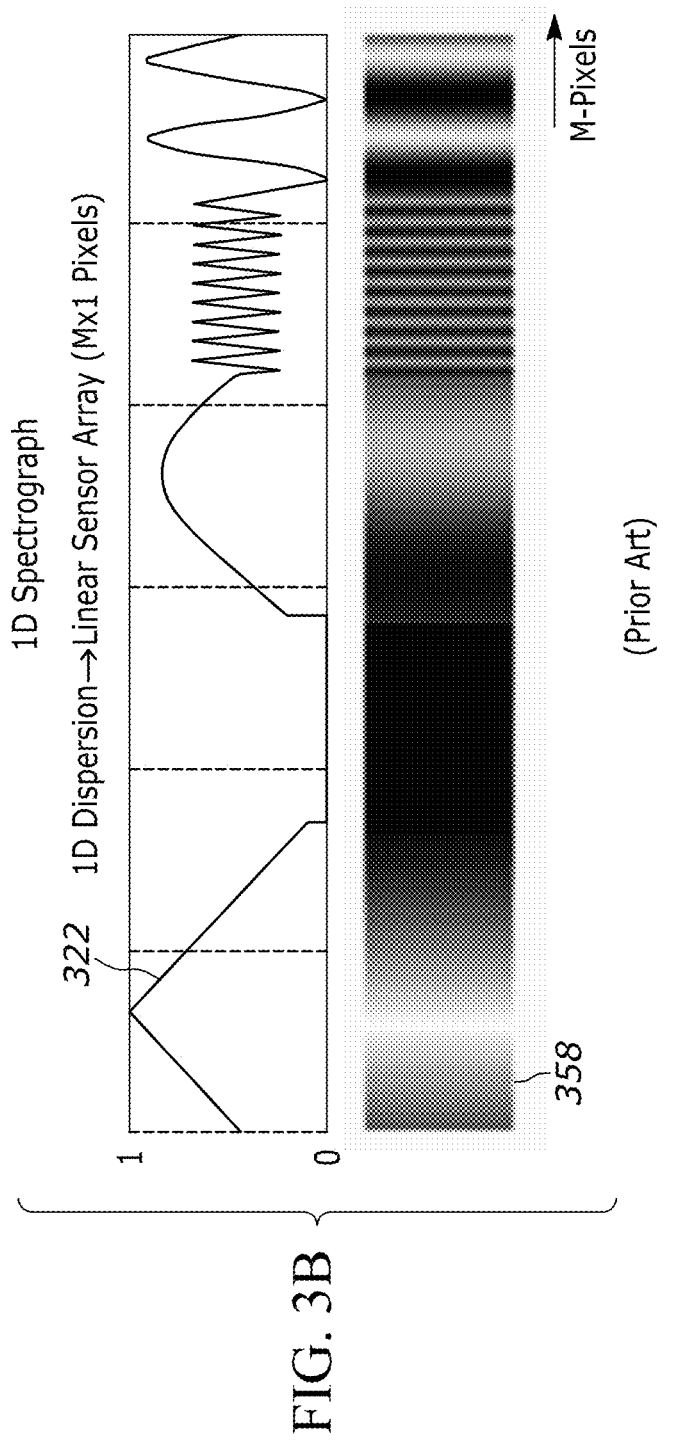
FIG. 3B illustrates a conventional technique of projecting the RF input signal from FIG. 3A onto a 1-dimensional (1D) photodetector array as a function of wavelength.

FIG. 3B illustrates a conventional technique of projecting the RF input signal 322 from FIG. 3A onto a 1-dimensional (1D) photodetector array 358 (e.g., a 1×M pixels photodetector array) as a function of wavelength. In the example of FIG. 3B, darker areas on the 1D photodetector array represent lower photonic intensity and lighter areas on the 1D photodetector array represent higher photonic intensity, with the relative darkness and lightness corresponding to the amplitude of the RF input signal. A drawback to such an approach is that the number of photodetectors is limited by the length of the row. For example, it may be impractical to have a single row of photodetectors that is long enough to provide high speed signal sampling over a wide optical spectrum.

Figure 3C:
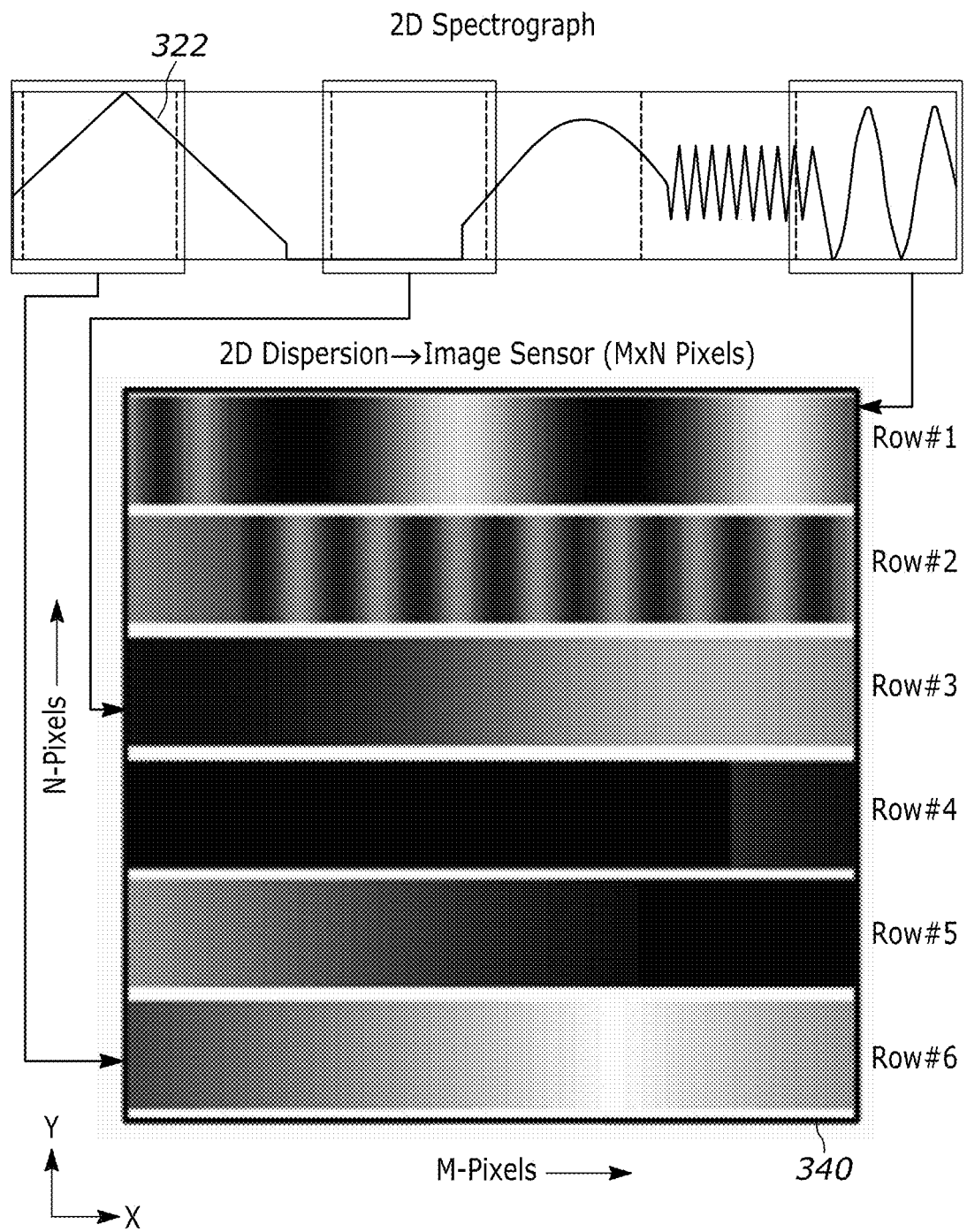
FIG. 3C illustrates a technique of projecting the RF input signal from FIG. 3A onto a 2D photodetector array as a function of wavelength.

As disclosed herein, a time-stretched optical pulse can be dispersed into 2D space to improve the performance of a signal sampling system. FIG. 3C illustrates a technique of projecting the RF input signal 322 from FIG. 3A onto a 2D photodetector array 340 (e.g., an M×N pixels photodetector array) as a function of wavelength. In the example of FIG. 3C, a first time interval (having corresponding wavelengths) is projected onto a first row (e.g., row #1) of photodetectors of the 2D photodetector array, a second time interval (having corresponding wavelengths) is projected onto a second row (e.g., row #2) of photodetectors of the 2D photodetector array, a third time interval (having corresponding wavelengths) is projected onto a third row (e.g., row #3) of photodetectors of the 2D photodetector array, a fourth time interval (having corresponding wavelengths) is projected onto a fourth row (e.g., row #4) of photodetectors of the 2D photodetector array, a fifth time interval (having corresponding wavelengths) is projected onto a fifth row (e.g., row #5) of photodetectors of the 2D photodetector array, and a sixth time interval (having corresponding wavelengths) is projected onto a sixth row (e.g., row #6) of photodetectors of the 2D photodetector array. That is, FIG. 3C illustrates a two-dimensional wavelength-to-space mapping of a modulated and wavelength dispersed optical pulse over an image sensor. As shown in FIG. 3C, a first time-instance of a corresponding modulated and wavelength dispersed optical pulse is spatially dispersed in to row #1 of the image sensor, a second time-instance of the corresponding modulated and wavelength dispersed optical pulse is spatially dispersed in to row #2 of the image sensor, a third time-instance of the corresponding modulated and wavelength dispersed optical pulse is spatially dispersed in to row #3 of the image sensor, a fourth time-instance of the corresponding modulated and wavelength dispersed optical pulse is spatially dispersed in to row #4 of the image sensor, a fifth time-instance of the corresponding modulated and wavelength dispersed optical pulse is spatially dispersed in to row #5 of the image sensor, and a sixth time-instance of the corresponding modulated and wavelength dispersed optical pulse is spatially dispersed in to row #6 of the image sensor. In the example of FIG. 3C, darker areas on the 2D photodetector array represent lower photonic intensity and lighter areas on the 2D photodetector array represent higher photonic intensity, with the relative darkness and lightness corresponding to the amplitude of the RF input signal.

Figure 3D:
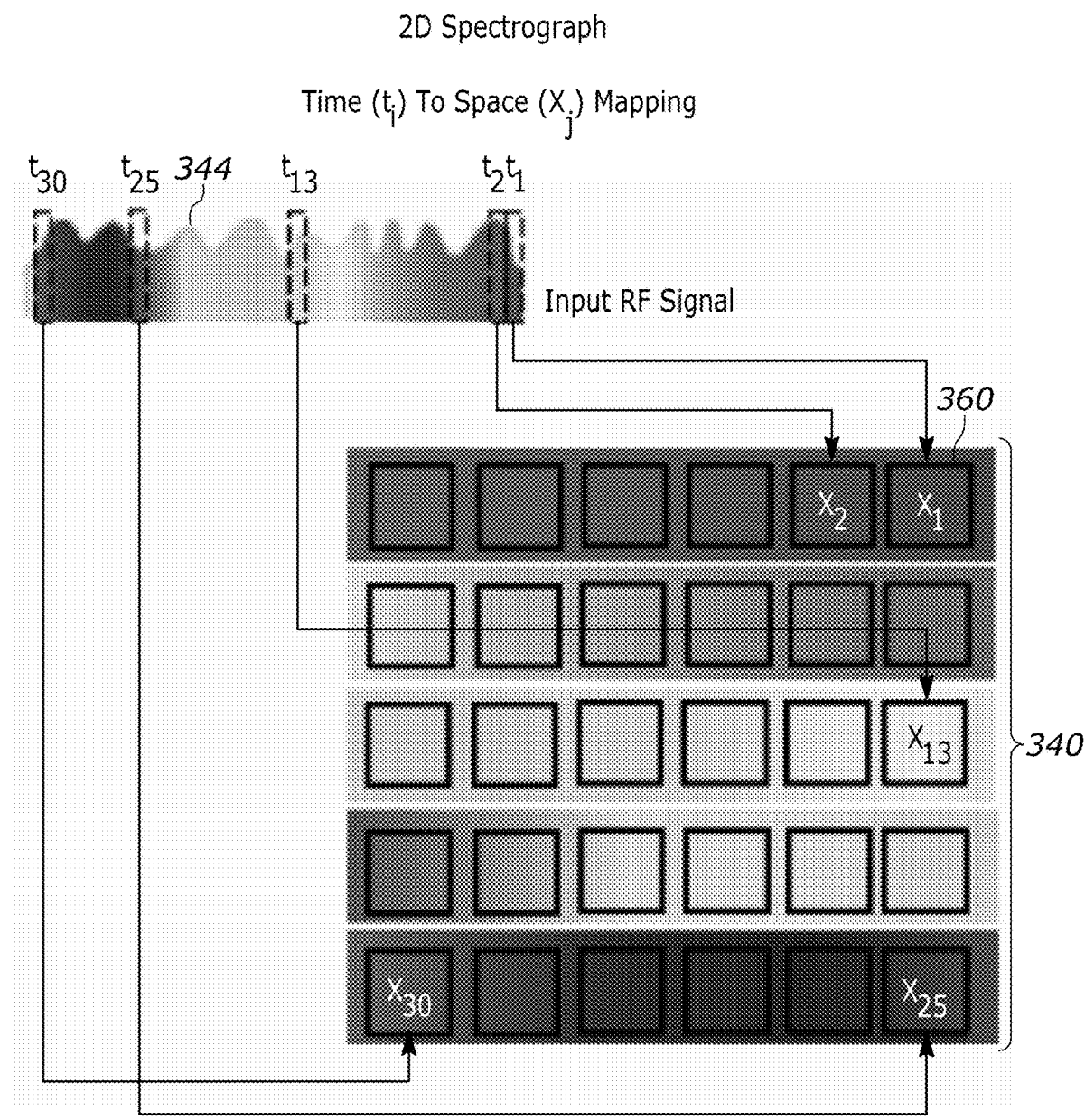
FIG. 3D illustrates the wavelength-to-space mapping of an example modulated and wavelength dispersed optical pulse in which the modulated and wavelength dispersed optical pulse has been modulated according to an input RF signal such as the signal illustrated in FIG. 3A.

FIG. 3D illustrates the wavelength-to-space mapping of an example modulated and wavelength dispersed optical pulse 344 in which the modulated and wavelength dispersed optical pulse has been modulated according to an input RF signal such as the signal illustrated in FIG. 3A. As shown in FIG. 3D, time-instance, t1, is mapped to a first pixel 360, e.g., pixel x1, on the two-dimensional image sensor 340, time-instance, t2, is mapped to a second pixel, e.g., pixel x2, on the two-dimensional image sensor, time-instance, t13, is mapped to a pixel, e.g., pixel x13, on the two-dimensional image sensor, time-instance, t25 is mapped to a pixel, e.g., pixel x25, on the two-dimensional image sensor, and time-instance, t30, is mapped to a pixel, e.g., pixel x30, on the two-dimensional image sensor. In the example of FIG. 3D, time-instances, t1-t6, are distributed in a first row of the image sensor that encompasses pixels x1-x6, time-instances, t7-t12, are distributed in a second row of the image sensor that encompasses pixels x7-x12, time-instances, t13-t18, are distributed in a third row of the image sensor that encompasses pixels x13-x18, time-instances, t19-t24, are distributed in a fourth row of the image sensor that encompasses pixels x19-x24, and time-instances, t25-t30, are distributed in a fifth row of the image sensor that encompasses pixels x25-x30. In FIG. 3D, each time-instance ($t_i$) is mapped by wavelength to a space ($x_j$) in a two-dimensional manner, e.g., in multiple rows distributed in space over a sensor array such as a CMOS image sensor, and wavelength is decreasing from pixel, x1, to pixel, x30. In the example of FIG. 3D, time increases from right to left and from top to bottom starting at the upper left corner and finishing at the lower left corner and wavelength decreases from left to right and from top to both starting at the upper right corner and finishing at the lower left corner. It should be noted that other spatial distributions of wavelength across a 2D space are possible.

Consider a hypothetical RF input signal, as shown in FIG. 3A, a 1D (one-dimensional) spectrograph (projection device) will project this signal onto a single row image sensor (linear array) and the intensity response from this signal as seen by the sensor will be as shown in FIG. 3B. In comparison, the 2D spectrograph will divide the input RF signal into smaller portions and each portion will be projected to a different row on the 2D image sensor, as illustrated in FIGS. 3C and 3D. For a 2D image sensor with M×N pixels, the signal will now be sampled with M×N pixels instead of M pixels as in the case of 1D spectrograph. The more pixels, the higher the sampling rate that can be achieved. An example of the time-to-space dispersion operation for a 2D spectrograph is illustrated in FIGS. 3C and 3D.

Figure 4:
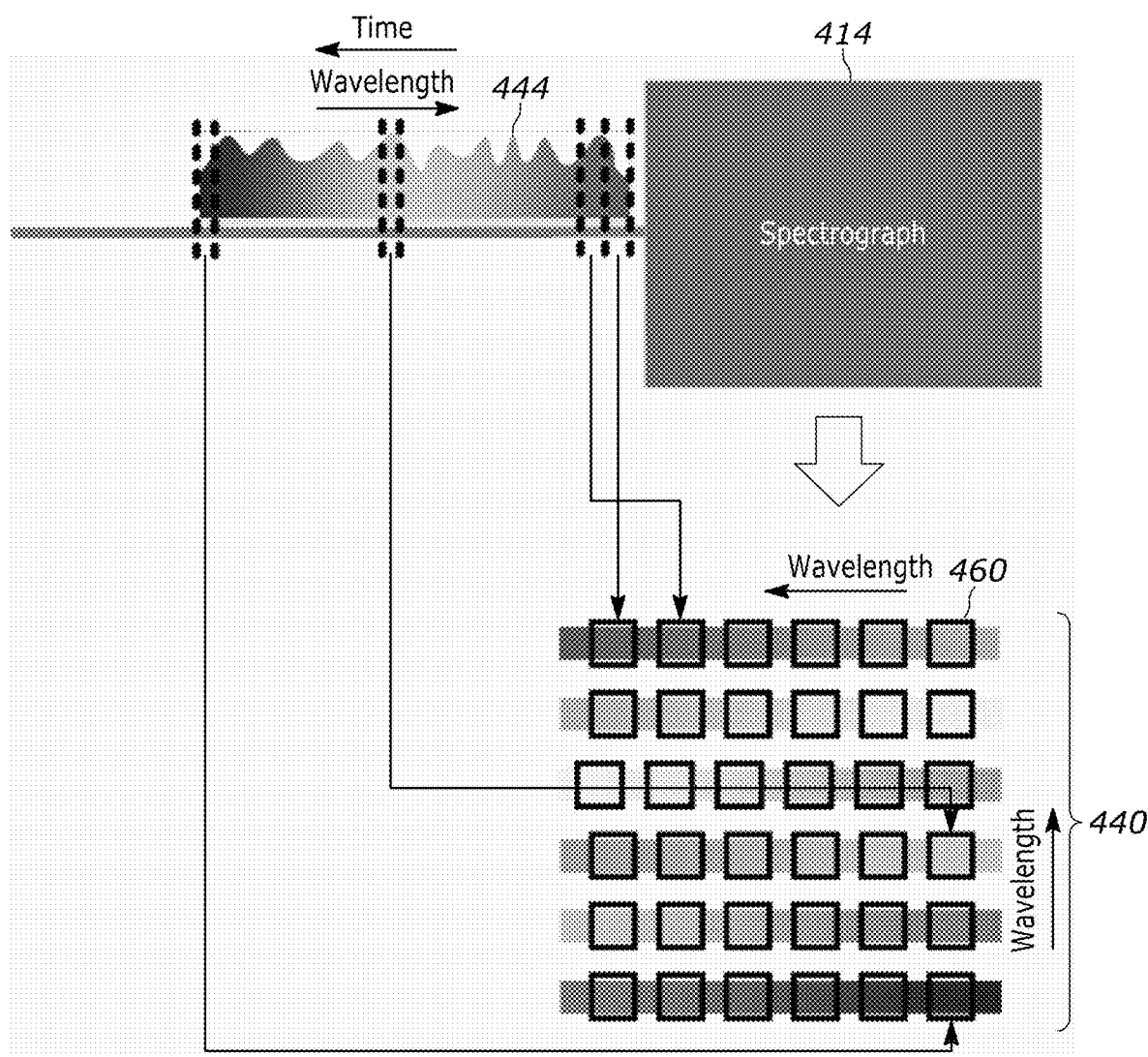
FIG. 4 is another example that helps illustrate the 2D time-to-wavelength-to-space mapping technique.

FIG. 4 is another example that helps illustrate the 2D time-to-wavelength-to-space mapping technique. As shown in FIG. 4, a different time instant of the modulated and wavelength dispersed optical pulse 444 (e.g., the optical signal that carries the input signal, which will get sampled, digitized and/or converted to the frequency domain with a Fourier transforming optics) is dispersed to a different spatial position, e.g., a different spatial position on the 2D surface of an image sensor, by the spectrograph 414 (e.g., the spatial dispersion system). In an example, the spectrograph (e.g., also referred to as the spatial dispersion system, the projection device, echelle grating) disperses the light onto a 2D array of photodetectors 440 in a way that every photodetector 460 (e.g., every pixel) receives a portion of the light with slightly different wavelength. In the example of FIG. 4, time increases from left to right and from top to bottom, starting in the upper left corner and finishing in the lower right corner, and wavelength increases from right to left and from bottom to top, starting in the lower right corner and finishing in the upper left corner. In some cases, some of the pixels will not receive any light and some pixels will receive light with equal wavelength. In general, the mapping will follow a "unique wavelength in every pixel" rule.

Figure 5:
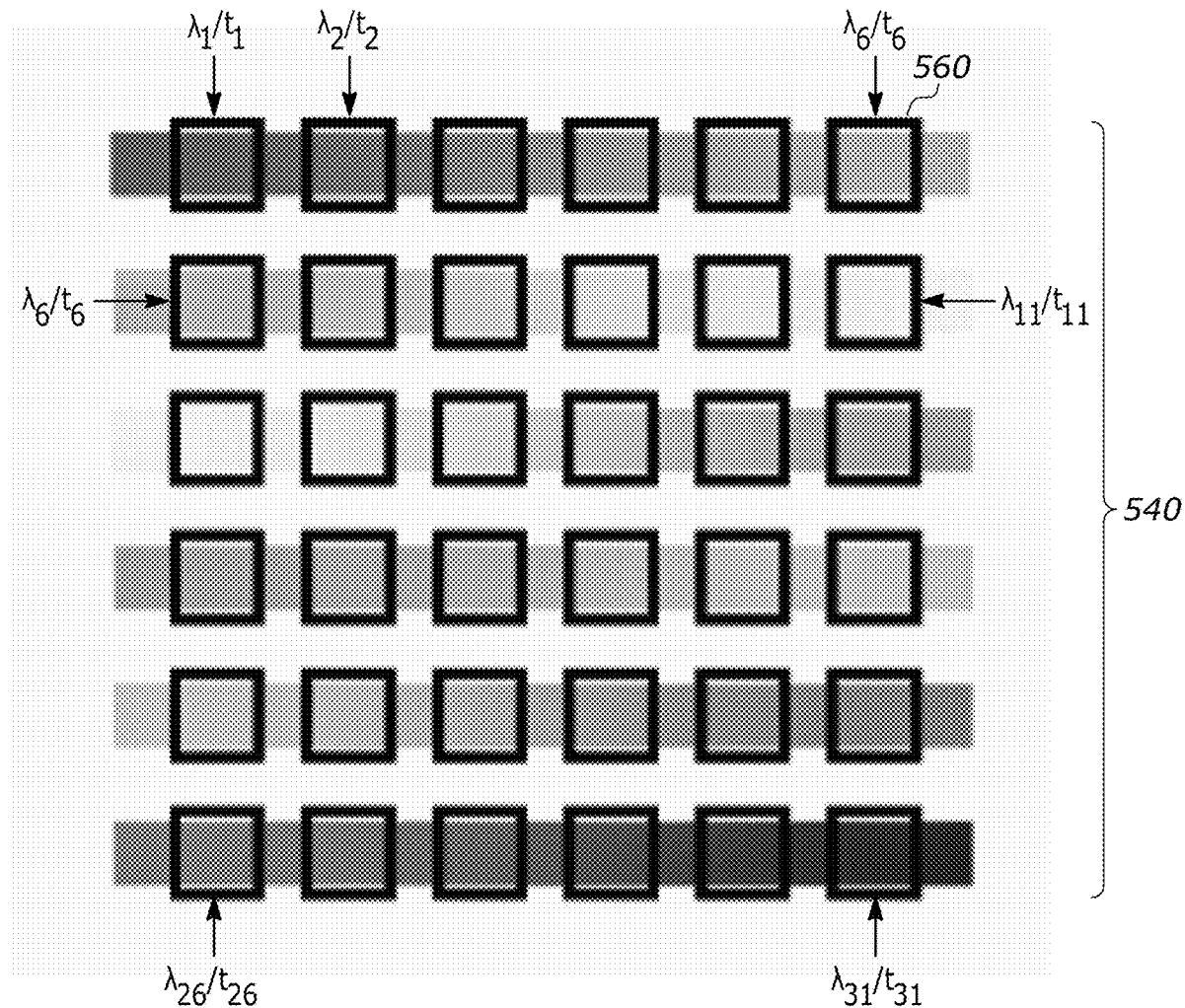
FIG. 5 further illustrates the pairing of time-instants and wavelengths and their mapping onto particular positions in 2D space in the 2D time-to-wavelength-to-space mapping.

FIG. 5 further illustrates the pairing of time-instants and wavelengths and their mapping onto particular positions in 2D space in the 2D time-to-wavelength-to-space mapping (translation). In FIG. 5, "λ" and "t" represent the wavelengths projected to each photodetector 560 (e.g., each pixel) of the 2D photodetector array 540 and the corresponding time instants of the input signal, respectively. In the example of FIG. 5, time increases from $t_1$ to $t_{31}$ and wavelength decreases from 21 to 231. One way to make a system more accurate is to have some signal overlap, especially for the last pixels of a row and the first pixels of the next row. FIG. 5 illustrates such an overlap between time and wavelength for some pixels. With the overlap, no time-instants get omitted in the transition points of the sensor. The overlap may also help in calibrating the system, since there are reference sampling points that have known values (as compared to other sampling points).

In the examples of FIGS. 3D, 4, and 5, each element in the 2D array of photodetectors represents a single photodetector (also referred to as pixels). However, in other examples, each element in FIGS. 3D, 4, and 5 may represent a set or block of photodetectors (or pixels) in a dense array of photodetectors, such as an image sensor, having, for example, multiple megapixels (MP), e.g., 2, 3, 5, 6, 8, 12, 24, or 48 MP. In another example, each element in FIGS. 3D, 4, and 5 may represent an area on an image sensor, such as a rectangle defined by four x and y coordinates.

Figure 6A:
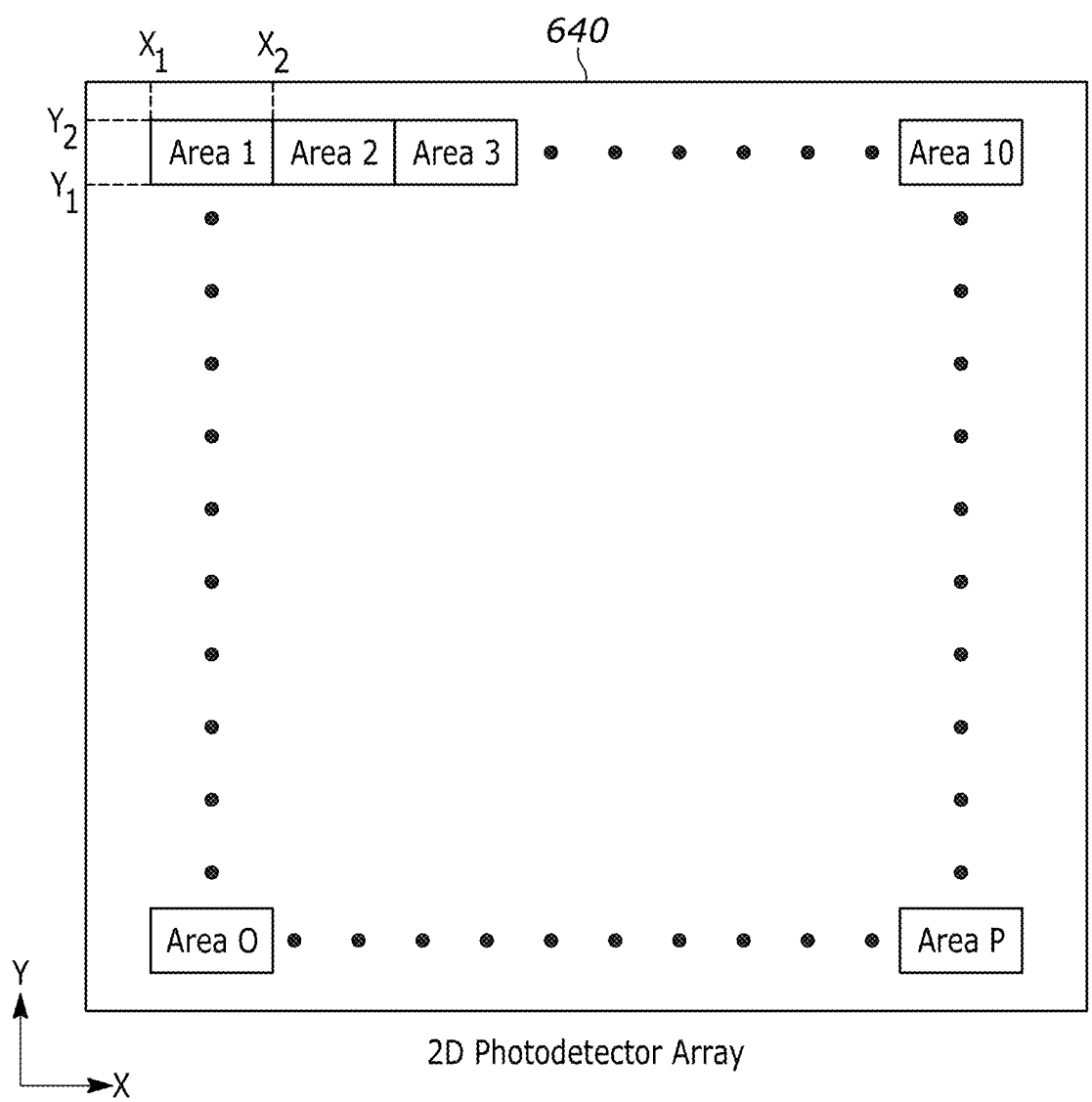
FIG. 6A is a plan view of an image sensor that includes a 2D photodetector array.

FIG. 6A is a plan view of an image sensor that includes a 2D photodetector array 640. For example, FIG. 6A is a plan view of an image sensor with 48 megapixels and x-y dimensions of 9.8 mm×7.3 mm. The image sensor shown in FIG. 6A is only an example, and image sensors with different numbers of pixels and sizes are possible.

FIG. 6B is an example of time-wavelength-space mapping 660 that corresponds to the image sensor of FIG. 6A. As shown in FIG. 6B, time intervals, wavelength ranges, and space (e.g., on the primary receiving surface of the image sensor) are mapped to each other. That is, each row of a time interval, a wavelength range, and a particular space correspond to each other in that, within a particular area, e.g., area 1, of the image sensor, it can be assumed that electromagnetic energy in the wavelength range of $\lambda_1$-$\lambda_{10}$ will be incident on the photodetectors in area 1 at the time interval of $t_1$-$t_{10}$. In the example of FIGS. 6A and 6B, there is no overlap between areas, that is, no areas on the image sensor that received electromagnetic energy at the same wavelength. The exact distribution of time and wavelength over the space of the 2D photodetector array is a function of the characteristics of time-to-wavelength dispersion system (e.g., that produces the time-stretched optical pulse) and the wavelength-to-space dispersion characteristics of the spatial dispersion system that produces the spatially dispersed optical pulse. The time-wavelength-space mapping can be designed into the system and/or learned through experimentation.

Space can be defined by coordinates. For example, as shown in FIGS. 6A and 6B, area 1 can be defined as a rectangle by coordinates $x_1$, $y_1$; $x_1$, $y_2$; $x_2$, $y_2$; $x_2$, $y_1$. Alternatively, space can be defined in terms of pixels, or some other way of defining the space into which the electromagnetic energy is spatially dispersed by the spatial dispersion system.

Figure 6C:
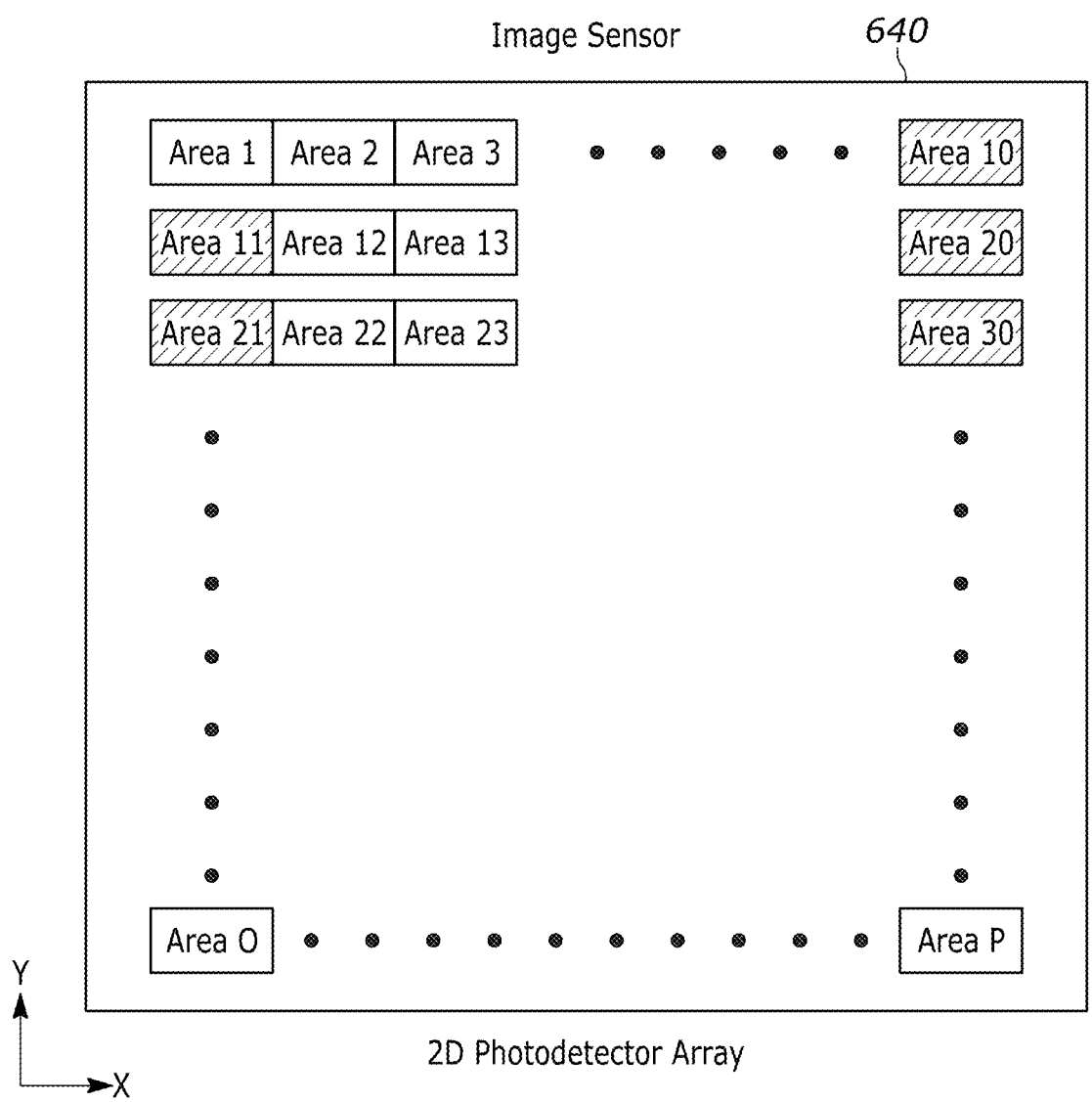
FIG. 6C is a plan view of an image sensor that includes a 2D photodetector array in which there is some overlap between time and wavelength.

As mentioned above, in some cases, it may be helpful to have some overlap of wavelength on the image sensor. FIG. 6C is a plan view of an image sensor that includes a 2D photodetector array 640 in which there is some overlap between time and wavelength. FIG. 6D is an example of time-wavelength-space mapping 662 that corresponds to the image sensor of FIG. 6C. As shown in FIG. 6D, time intervals, wavelength ranges, and space (e.g., on the primary receiving surface of the image sensor) are mapped to each other. That is, the values of time interval, wavelength range, and space in a row correspond to each other. In the example of FIGS. 6C and 6D, there is overlap between areas on the image sensor, that is, at least some areas on the image sensor receive electromagnetic energy at the same wavelength at the same time. For example, areas 10 and 11 (which are on different rows) will both receive light at wavelengths $\lambda_{91}$-$\lambda_{100}$ at times $t_{91}$-$t_{100}$, respectively. Likewise, areas 20 and 21 (which are on different rows) will both receive light at wavelengths $\lambda_{191}$-$\lambda_{200}$ at times $t_{191}$-$t_{200}$, respectively. In the example of FIG. 6C, the image sensor is 48 MP and has x-y dimensions of 9.8 mm×7.3 mm. The exact distribution of time and wavelength over the space of the 2D photodetector array is a function of the characteristics of time-to-wavelength dispersion system (e.g., that produces the time-stretched optical pulse) and the wavelength-to-space dispersion characteristics of the spatial dispersion system that produces the spatially dispersed optical pulse.

In an embodiment, the time-wavelength-space mapping is programmed into a computer-implemented process to enable the received digital data to be deciphered. For example, the time-wavelength-space mapping is programmed into a decoding process that is implemented by the processor. The process can be implemented in hardware, in software, or in a combination of hardware and software using a known time-wavelength-space mapping.

Figure 7A:
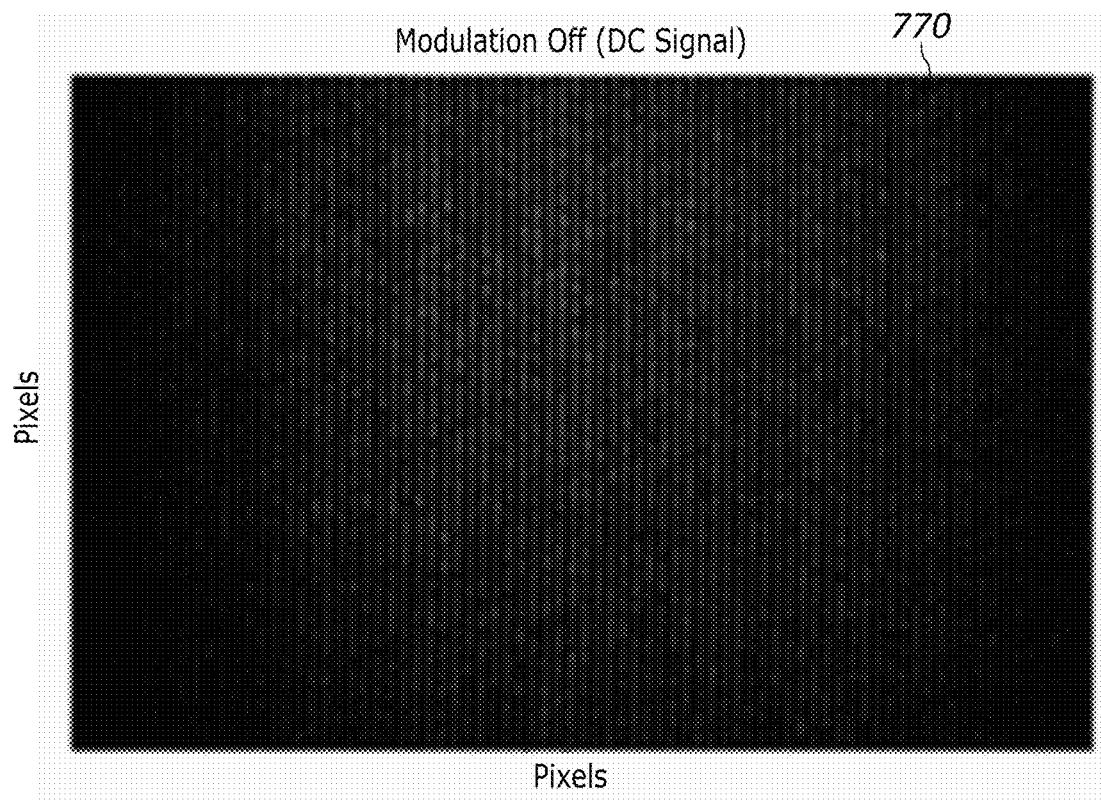
FIG. 7A is an example pattern on an image sensor when no modulation from an input signal is applied to the time-stretched optical signal.
Figure 7B:
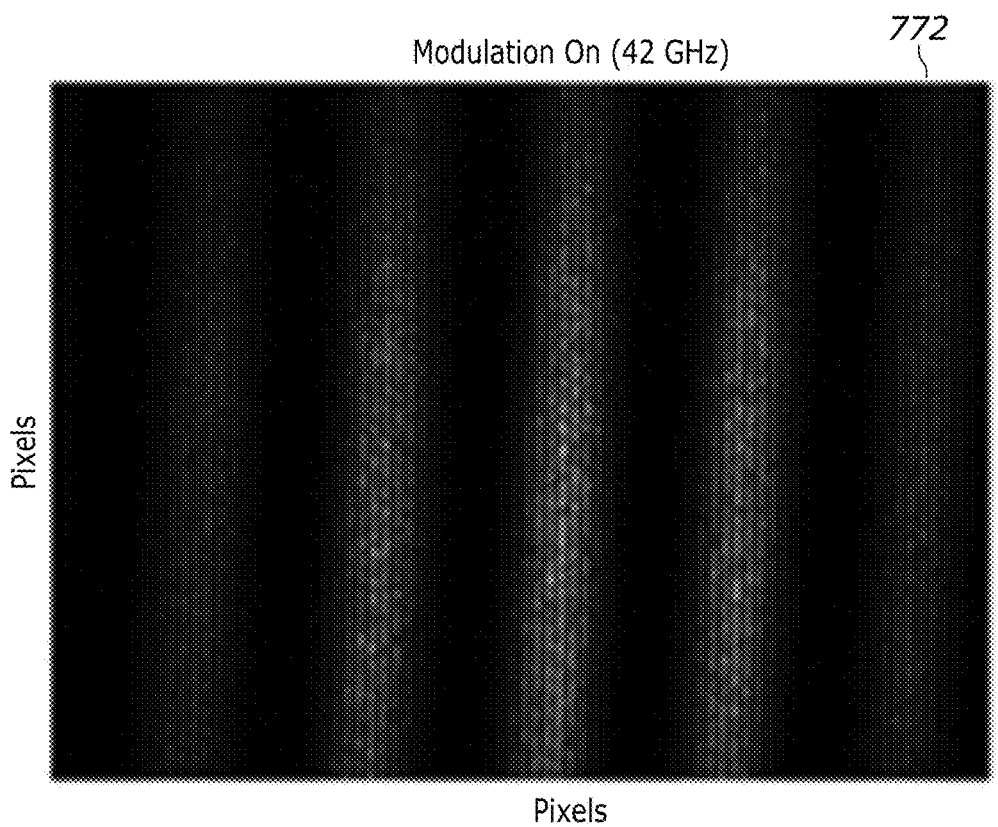
FIG. 7B is an example pattern on an image sensor when the time-stretched optical signal is modulated with an input signal at 42 GHz.
Figure 7C:
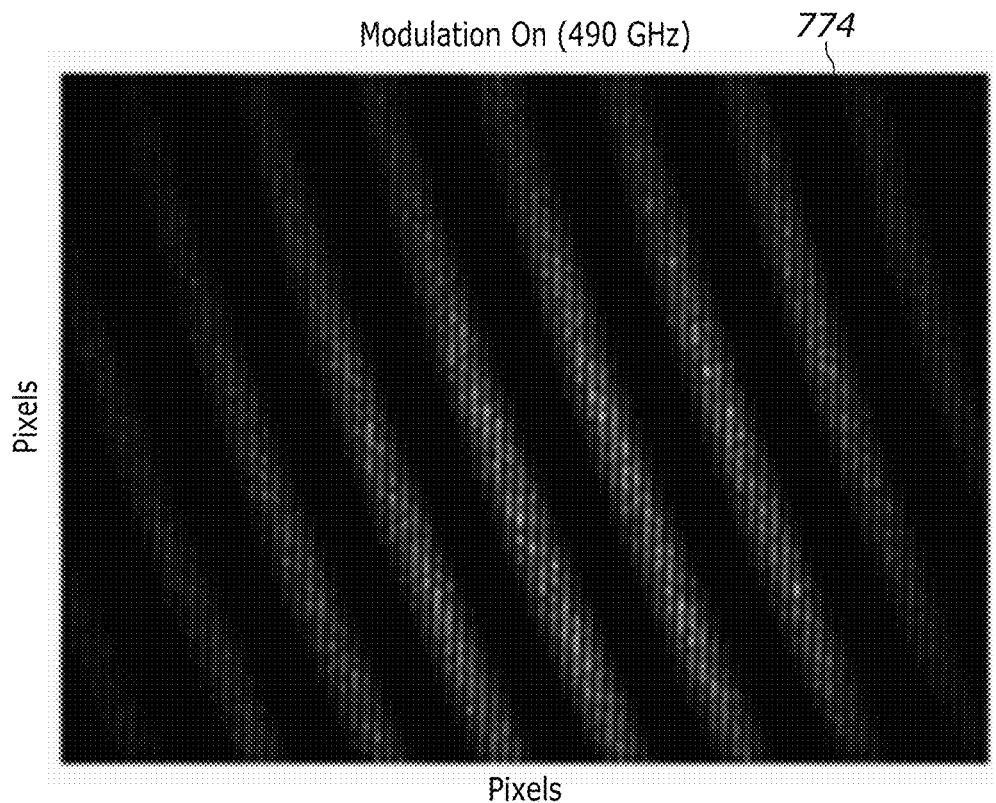
FIG. 7C is an example pattern on an image sensor when the time-stretched optical signal is modulated with an input signal at 490 GHz.
Figure 7D:
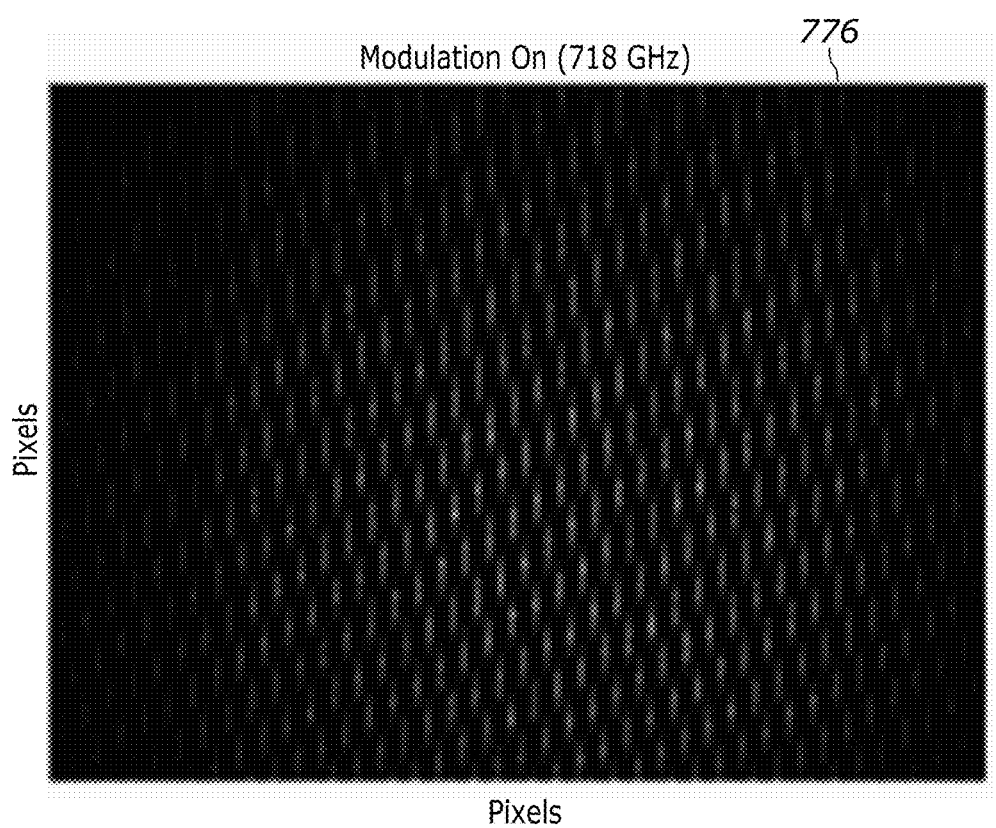
FIG. 7D is an example pattern on an image sensor when the time-stretched optical signal is modulated with an input signal at 718 GHz.

FIGS. 7A-7D illustrate examples of patterns that may be detected on a 2D photodetector array using the techniques disclosed above. In particular, FIG. 7A is an example pattern 770 on an image sensor when no modulation from an input signal is applied to the time-stretched optical signal, FIG. 7B is an example pattern 772 on an image sensor when the time-stretched optical signal is modulated with an input signal at 42 GHz, FIG. 7C is an example pattern 774 on an image sensor when the time-stretched optical signal is modulated with an input signal at 490 GHz, and FIG. 7D is an example pattern 776 on an image sensor when the time-stretched optical signal is modulated with an input signal at 718 GHz. As described with reference to FIGS. 3A-3D, the relative darkness and lightness of the patterns corresponds to the amplitude of the input signal of interest.

As an example, using the techniques disclosed herein, when the chirped pulse length is 10 ns (nanoseconds) and it is projected over a photodetector array of 1 million pixels, the effective sampling rate is 1,000,000 samples/10 ns=100 TSPS (terasamples per second). This sample rate is 25,000 times higher than the 4GSPS (gigasamples per second) rate reported for the fastest sample and hold amplifiers that are commercially available. An embodiment of the system functions as a sampler and digitizer. The fastest digitizers reported in literature have sampling rates of around 100GSPS while the methods and systems disclosed herein provide on the order of 1,000 times higher sampling rate. The fastest sampling rate reported for known photonics assisted digitizers to date is 77GSPS.

In addition to providing an extremely high sampling rate, the techniques disclosed herein have very low jitter because sampling time is now determined precisely by the fixed position of a pixel in the sensor array. The light enters the photodetectors (e.g., pixels) sometime during the photodetectors integration periods. The time instant of the light arrival or the sampling action of the signal is not set by a clock signal, as in an electronic digitizer. Jitter or time-skew, which are typical problems for an electronic digitizer, do not affect the sampling action at this first sampling stage since the system does not respond to a clock signal. Moreover, the analog signals that are read from the photodetectors (e.g., pixels) are "flat" (constant in time) and the sampling jitter (random variation in the exact sampling instant) in the electronic ADC sampling clock does not cause a significant error in the magnitude of the sampled signal at the second stage where the signal gets sampled in the system chain, e.g., where the sample and hold stage of an electronic ADC samples the (already sampled) analog signal stored in the pixels.

As disclosed above, a light signal modulated with an electromagnetic signal (e.g., an RF input signal) that contains the information of interest is projected over a 2D array of photodetectors and the resulting photo-induced charges are stored in the photodetector array until read out with electronic circuitry, effectively forming a sample and hold circuit that has very high combined sampling rate due to the fact that the individual photodetectors receive different wavelengths of the light signal which carry different time instants of the signal of interest. The system also has low jitter (due to the fact that operation does not need any clock signals) and can also be optimized for very low noise (due to the possibility of averaging millions of parallel signals).

Another embodiment of a system is a sampling digitizer (also called analog to digital converter). The sampling rate can easily reach hundreds of terasamples per second. This system can operate in a "single shot" sampling fashion, meaning a portion of the input signal is sampled and digitized, when triggered/commanded to do so.

Another embodiment of a system is a continuous digitizer (or ADC). This embodiment differs from the previous embodiments in the sense that the system samples and digitizes the input signal in a continuous fashion.

In an example, the input signal can be RF, or some other high frequency electromagnetic signal, e.g., 1 kHz-800 GHz.

Another embodiment is a photonic assisted signal analyzer system. In an example, the front end of the photonic signal analyzer uses wave velocity dispersion in optical fiber with a Mach-Zehnder optical modulator to perform a time-to-optical wavelength translation for an RF input signal as described above. Next, a spatial dispersion system (e.g., a spectrograph) performs a wavelength-to-position translation by dispersing the modulated optical signal in two dimensions. The overall result is an irradiance pattern at the spectrograph exit plane that corresponds to the time-dependence of the RF signal, and which is the input for the back end of the photonic signal analyzer. Now, the back end of the photonic signal analyzer uses optical Fourier transforming optics, which translates the irradiance pattern at the spatial dispersion system (e.g., spectrograph) exit plane into an image, on a 2D photodetector array, that represents the frequency components of the RF signal.

In an embodiment, a frosted optical surface placed at the exit plane of the spatial dispersion system (e.g., spectrograph) causes sufficient overlap of the light from every point in the irradiance image on Fourier transforming optics. The irradiance pattern of light modulated with a sinusoidal electrical signal at the exit plane of the spatial dispersion system (e.g., spectrograph) can be imaged with a 2D photodetector array. In addition to providing frequency domain information, the significant reduction in the amount of data to be read out provides a very fast signal analysis system.

This type of system can be also called a photonic assisted analog to information converter, or a photonic assisted analog to feature converter.

An embodiment of such a system can also be used as the basis of an ultra-wide-bandwidth spectral awareness receiver system. This type of system can be used to find even small amounts of spectral energy very quickly within a wide bandwidth, e.g. 100 GHz. After candidate signal bands have been found, then a more accurate system can be used to tune to these frequencies to fully characterize them.

Figure 8:
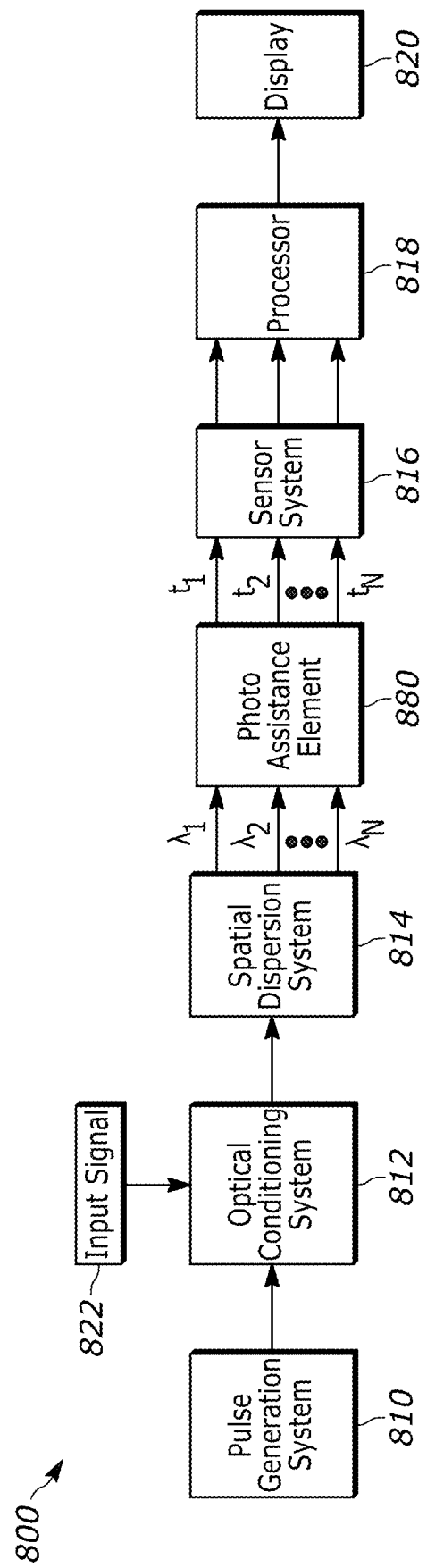
FIG. 8 is a system, similar to the system of FIG. 1, which includes a photonics assistance element between the spatial dispersion element and the image sensor.

FIG. 8 is a system 800, similar to the system 100 of FIG. 1, which includes a photonics assistance element between the spatial dispersion element and the image sensor. The system of FIG. 8 includes a pulse generation system 810, an optical conditioning system 812, a spatial dispersion system 814, a photonics assistance element 880, a sensor system 816, a processor 818, and a display 820. In the example, the photonics assistance element includes a Fourier transforming optical element, e.g., an FFT lens.

Figure 9A:
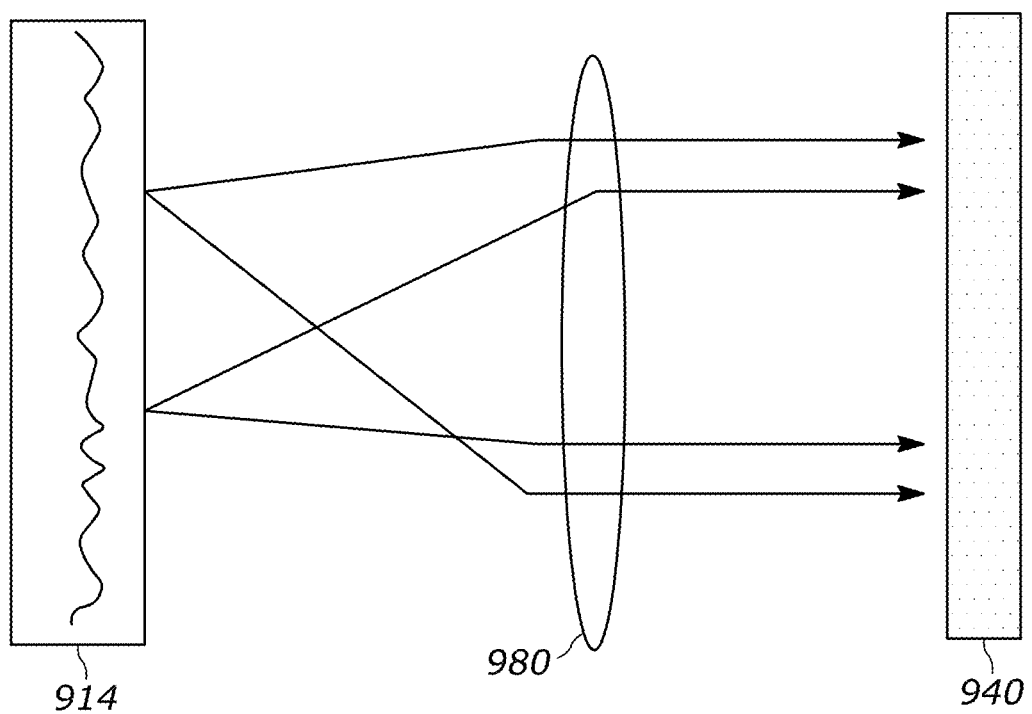
FIG. 9A depicts an example of a spatial dispersion system and a photonic assistance element along with a photodetector array.

FIG. 9A depicts an example of a spatial dispersion system 914 and a photonic assistance element 980 along with a photodetector array 940. In the example of FIG. 9A, the spatial dispersion system may include an optical element with a frosted optical surface such that an irradiance image will correspond to the time dependence of the input signal (e.g., RF input signal) and the photonic assistance element includes a Fourier transforming optical element such as an FFT lens. The example of FIG. 9A illustrates how in a back-end system of the photonic signal analyzer, Fourier transforming optics translates the irradiance pattern at the exit plane of the spatial dispersion system (e.g., a spectrograph) into an image that represents the frequency components of the RF signal.

The addition of such a subsystem to a processing chain enables direct and 100× faster spectrum analysis capability. Such a system combines the extremely fast digitizer (e.g., sensor system) with an optical sub-system that performs a fully-parallel spatial optical fast Fourier transform (FFT) at extremely high speeds, e.g., in less than a nanosecond. The result is a receiver technology that can monitor up to 100× wider bandwidth than current solutions and is expected to perform signal identification and analysis (in the form of an FFT) at least 100× faster than current solutions.

Figure 9B:
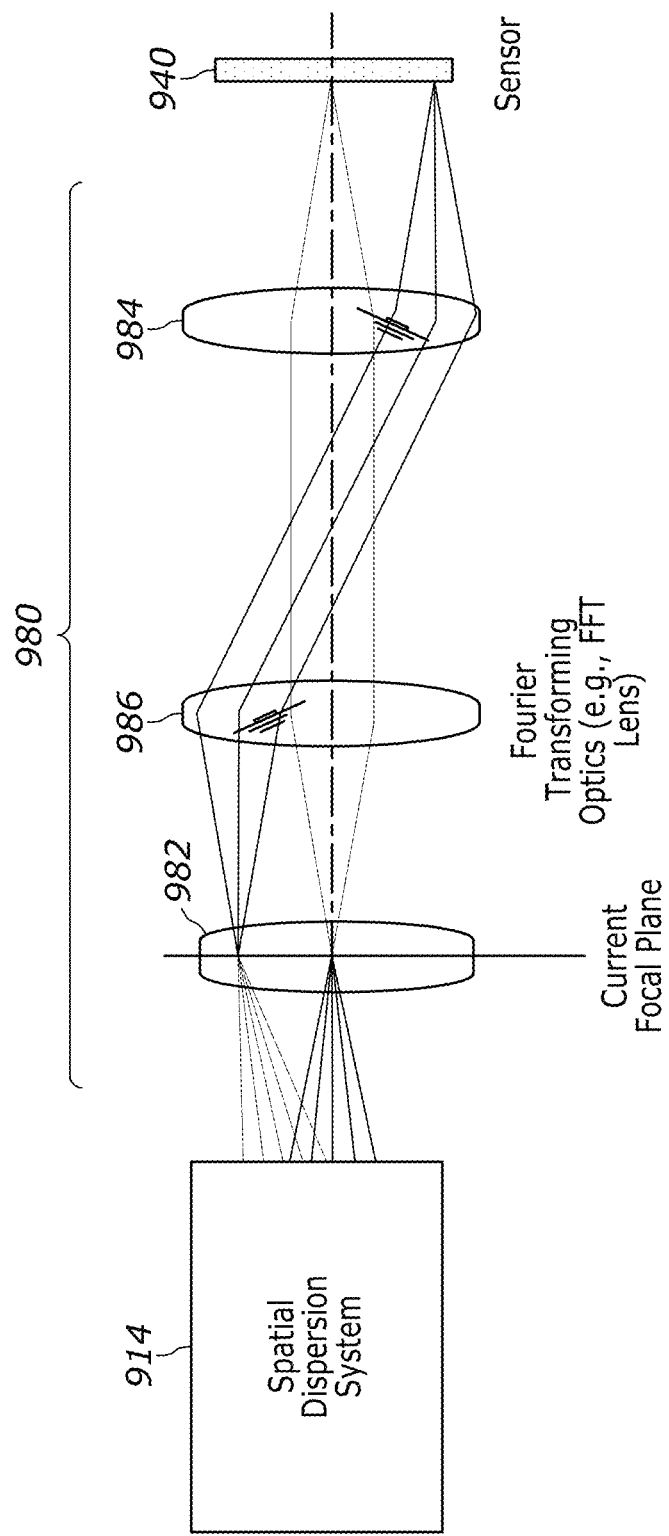
FIG. 9B depicts another example of a spatial dispersion system and a photonic assistance element along with a photodetector array.
Figure 10A:
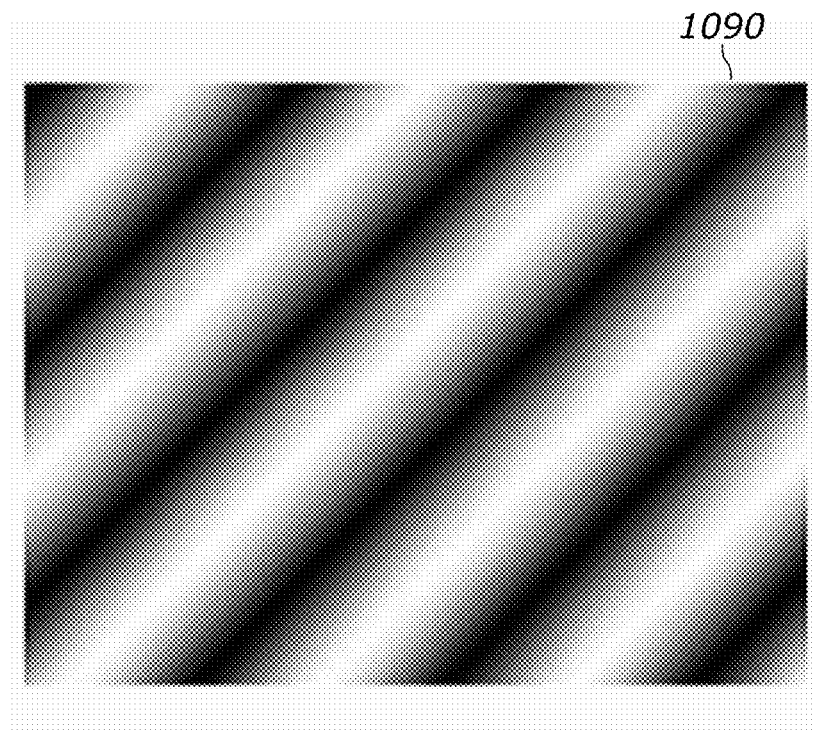
FIG. 10A shows an example irradiance pattern of light modulated with a sinusoidal electrical signal at the exit plane of the spatial dispersion system imaged with a 2D photodetector array in a case with no photonic assistance element.
Figure 10B:
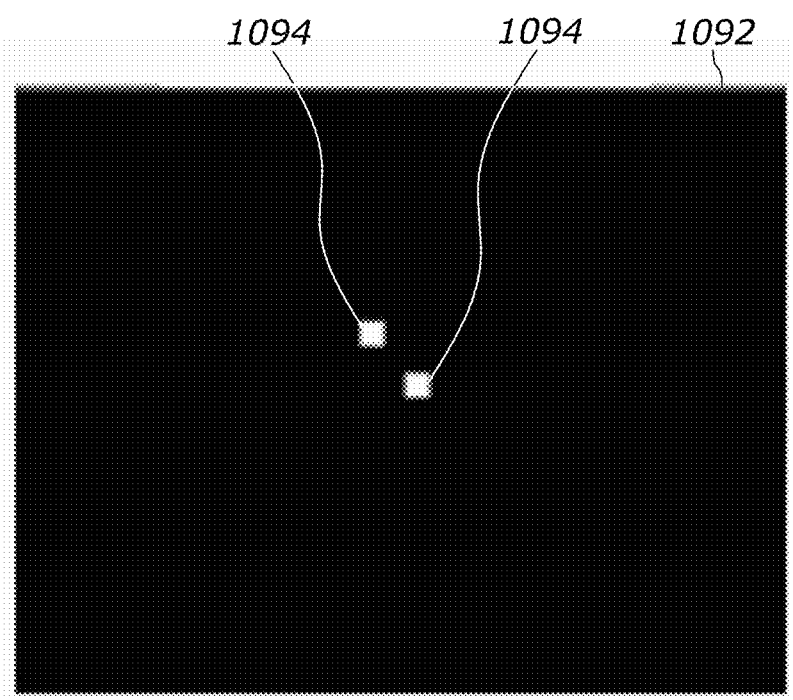
FIG. 10B shows the same irradiance pattern in the case in which the irradiance pattern of light modulated with a sinusoidal electrical signal at the exit plane of the spatial dispersion system is subjected to Fourier transforming optics before being incident on the 2D photodetector array.

The concept of this system requires coupling of a photonics assistance element (e.g., FFT lens) to the spatial dispersion system. A simplified illustration of an optical layout is shown in FIG. 9B, which includes a spatial dispersion system 914 as described above and a photonics assistance element 980 that includes a first lens 983, a second lens 984, and an FFT lens 986 in an optical path between the first and second lenses. In an example, the pulse generation system, the optical conditioning system, and the spatial dispersion system are utilized as described above, however, the irradiance at the focal plane (e.g., the spatially dispersed optical pulse that is output from the spatial dispersion system) is not directly detected using the sensor system. Instead, the focal plane is relayed and re-imaged on to a new image plane by the photonics assistance element 980 which will be proportional to a Fourier transform operation of the original focal plane irradiance. In this manner, an analog optical Fourier transform will be performed, and the spectrum of interest will be directly and instantly accessible. As a well-known relationship given by equation (1) below, the Fourier transform of a sine wave with frequency A will result in two delta functions that are+/−A apart in frequency around the center zero frequency.

$$G(f)=\Im\{\sin(2\pi At)\}=0.5[\delta(f-A)+\delta(f+A)]$$ Equation (1):

Similarly, the Fourier transform of the irradiance pattern of a sinusoidal signal (e.g., a representation of the actual RF input signal) will be observed as two delta-function "spots" in the reimaged focal plane as shown in FIG. 10B.

FIG. 10A shows an example irradiance pattern 1090 of light modulated with a sinusoidal electrical signal at the exit plane of the spatial dispersion system (e.g., a spectrograph) imaged with a 2D photodetector array in a case with no photonic assistance element. In the example of FIG. 10A, the sinusoidal electrical signals appear as alternating light and dark diagonal lines.

FIG. 10B shows the same irradiance pattern 1092 in the case in which the irradiance pattern of light modulated with a sinusoidal electrical signal at the exit plane of the spatial dispersion system (e.g., a spectrograph) is subjected to Fourier transforming optics before being incident on the 2D photodetector array. In the example of FIG. 10B, after the Fourier transforming optics as shown in FIG. 9B, the sinusoidal electrical signals appear as two bright dots 1094 in an otherwise dark set of photodetectors.

Figure 11:
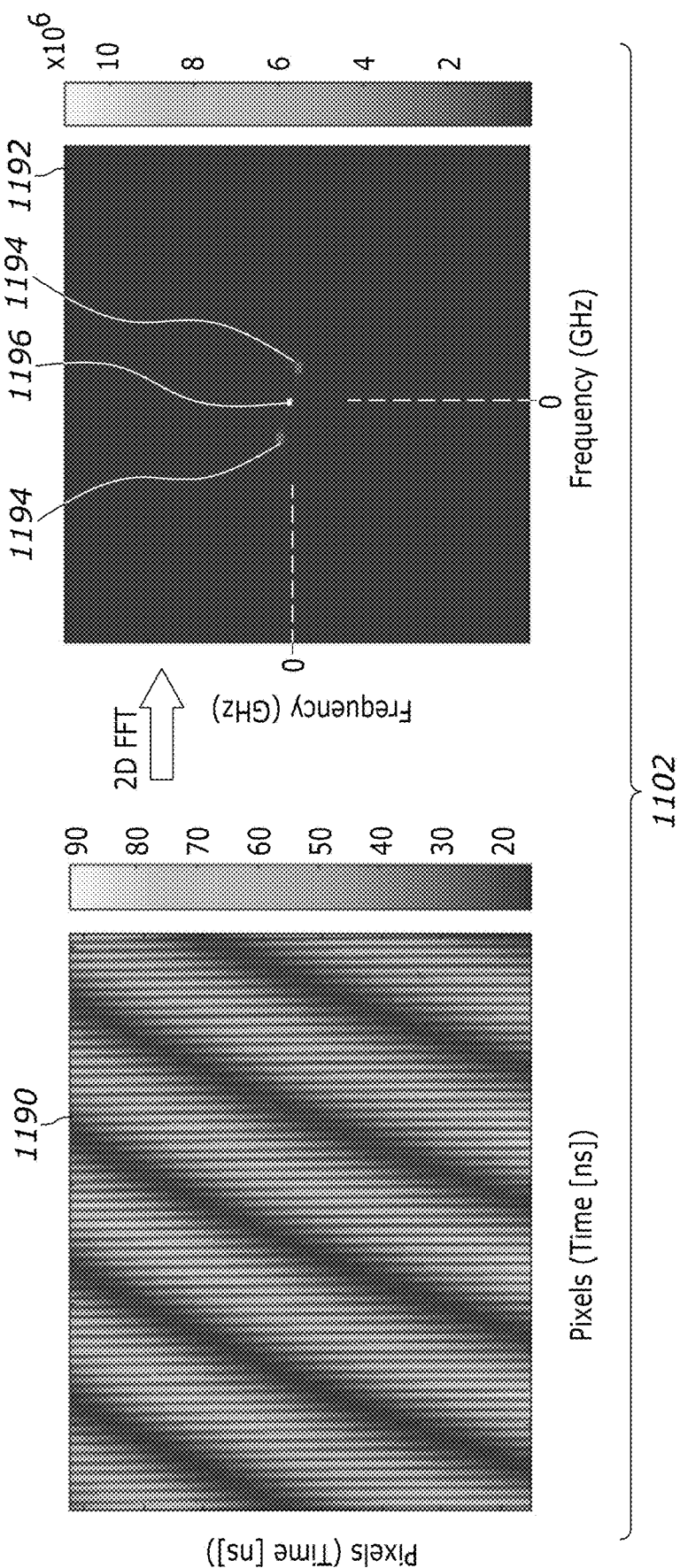
FIG. 11 illustrates a 2D FFT operation that can be performed by a processor on digital data from an image sensor system.

FIG. 11 illustrates an offline 2D FFT operation 1102 that can be performed by a processor on digital data from an image sensor system. The left side of FIG. 11 is a pattern 1190 that represents the values detected at the photodetectors (pixels) in a photodetector array relative to each other in the time domain. That is, the relative grayscale of the values is representative of the relative intensity of the electromagnetic energy that is detected at each photodetector. A digital process can then transform the data represented on the left hand side using a FFT operation. The right side of FIG. 11 is a pattern 1192 that represents the detected electromagnetic energy in the frequency domain. In particular, the right side includes two "dots" 1194 that are located around a center "dot" 1196. That is, FIG. 11 shows an offline (slow) 2D FFT operation of lab data from a system using MATLAB. The zero (center) frequency and the two delta functions (spots) around the center are shown.

In addition to providing instant frequency domain information, a significant benefit of such a system is the significant reduction in the amount of data to be read out which is an enabler for a rapid spectrum awareness technology. Going from having to read out a whole 2D photodetector array to only a single line of photodetectors in the 2D photodetector array opens a whole new set of possibilities in terms of readout electronics. Many smart Region-of-Interest (ROI) readout techniques (such as automatically finding and processing the spots of interest) can be employed providing an expected of at least 100× faster speed. For close to real time spectrum awareness is expected to be possible with this technology.

One of the considerations of the optical design is telecentricity so that chief ray is parallel to the optical axis and therefore magnification of the pattern will not change as a function of sensor position. This is expected to be advantageous in the processing of images and registration of pixels. The optical system will also need to be carefully pupil matched for minimization of any vignetting for light budget considerations.

The current disclosure includes a sampling technique in which a light signal modulated with an electromagnetic signal that contains information of interest is projected over an array of photodetectors (elements that produce charge carriers when illuminated with light) and the resulting photo-induced charge is stored in the photodetector array in the form of photo-induced charge until read out or digitized, effectively forming a sample and hold circuit for the electronic signal. If the sampled and held values are digitized, the system forms a digitizer. Digitizer is also called an analog to digital converter (ADC). The system maps the time instants of the signal of interest first to wavelengths of the carrier light signal and then to unique spatial locations on the photodetector array. The wavelength to position mapping is based on using a projection device (e.g. grating) designed to perform this function. The fact that the photodetectors each receive a separate time-instant of the signal increases the sampling rate of the system to N/t, where N is the quantity of photodetectors receiving unique wavelengths and t is the length of the light pulse. The modulated light may be processed with optical or photonic devices before it enters the photodetectors.

In one embodiment of the present disclosure, a light signal modulated with an electrical signal that contains information of interest is projected over an array of photodetectors and the resulting photo-induced charges are stored in the photodetector array until read out with electronic circuitry, effectively forming a sample and hold circuit that has very high bandwidth and low jitter.

An ultra-high sampling rate (time interleaved) sample and hold circuit and/or a digitizer is formed when an electronic signal of interest is superimposed into a chirped and elongated light pulse with an electro-optical modulator and then the light pulse is projected over an array of photodetectors with a light projection device that spreads different wavelengths on different locations on the photodetector array. Examples of photodetector arrays include 1D and 2D image sensors made of different materials and having different architectures (e.g., array of photodiodes, silicon CMOS and CCD image sensors, III-V infrared sensors, etc.).

In an embodiment, the system forms a digitizer or an analog-to-digital converter (ADC) when the sampled values are digitized within the photodetector array or somewhere else in the system.

In an embodiment, the light projection device provides spatial separation of wavelengths onto a photodetector array by means of echellette and/or echelle diffraction gratings, dispersing prisms, and/or Virtually Imaged Phased Arrays (VIPA).

In an embodiment, a light projection device includes an optical architecture where collimated space is formed using a transmissive, reflective, or catadioptric element, followed by a fine groove pitch (echellette) transmissive or reflective diffraction grating providing angular separation of wavelengths. Diffraction order overlap is small with low-order grating therefore an order-sorting filter (OSF) can be used to eliminate any diffraction order overlapping. Collimated and wavelength dispersed light is then focused onto a 1D array of photodetectors by means of transmissive, reflective, or catadioptric elements.

In an embodiment, a light projection device includes an optical architecture where collimated space is formed using a transmissive, reflective, or catadioptric element followed by a coarse groove pitch (echelle) diffraction grating providing tens of overlapping diffraction orders in X-direction. A transmissive or reflective fine-pitch (echellette) grating is placed before or after the coarse-pitch (echelle) grating in a perpendicular manner as a means of cross-dispersing the overlapping orders to Y-direction. Collimated light is then focused onto a 2D array of photodetectors by means of transmissive, reflective, or catadioptric elements.

In an embodiment, a light projection device includes an optical architecture where collimated space is formed using a transmissive, reflective, or catadioptric element followed by a cylindrical lens that shapes the beam into a line, followed by a Virtually Imaged Phased Array (VIPA) providing very high dispersion. A fine groove pitch (echellette) diffraction grating is placed after VIPA in a perpendicular manner as a means of cross-dispersing the overlapping orders to Y-direction. Light is then focused onto a 2D array of photodetectors by means of transmissive, reflective, or catadioptric elements.

Example 1) An apparatus comprising: transmissive, reflective or catadioptric element producing collimated light; a fine groove pitch (echellette) transmissive or reflective diffraction grating providing angular separation of wavelengths; an order-sorting filter (OSF) to eliminate any diffraction order overlapping; transmissive, reflective or catadioptric elements arranged to direct and focus light onto a 1D array of photodetectors.

Example 2) An apparatus (which may be used to implement the technique recited in item 1) comprising: transmissive, reflective or catadioptric element producing collimated light; a coarse groove pitch (echelle) diffraction grating providing tens of overlapping diffraction orders in a single direction (example, X-direction) with angularly separated wavelengths; a transmissive or reflective fine-pitch (echellette) grating placed before or after the coarse-pitch (echelle) grating in a perpendicular manner as a means of cross-dispersing the overlapping orders to a secondary direction (example, Y-direction). Transmissive, reflective or catadioptric elements arranged to direct and focus light onto a 2D array of photodetectors.

Example 3) An apparatus (which may be used to implement the technique recited in item 1) comprising: transmissive, reflective or catadioptric element producing collimated light; a coarse groove pitch (echelle) diffraction grating providing tens of overlapping diffraction orders in a single direction (example, X-direction) with angularly separated wavelengths; a highly dispersing prism placed before or after the coarse-pitch (echelle) grating in a perpendicular manner as a means of cross-dispersing the overlapping orders to a secondary direction (example, Y-direction). Transmissive, reflective or catadioptric elements arranged to direct and focus light onto a 2D array of photodetectors.

Example 4) An apparatus (which may be used to implement the technique recited in item 1) comprising: transmissive, reflective or catadioptric element producing collimated light; a cylindrical element producing a line shape; a Virtually Imaged Phased Array (VIPA) providing very high wavelength dispersion and many overlapping diffraction orders in a single direction (example, X-direction); a fine groove-pitch (echelle) diffraction grating placed before or after VIPA in a perpendicular manner as a means of cross-dispersing the overlapping orders to a secondary direction (example, Y-direction). Transmissive, reflective or catadioptric elements arranged to direct and focus light onto a 2D array of photodetectors.

In an example, the disclosed technique involves an electromagnetic signal (e.g., an analog electrical signal, digital electrical signal, radio frequency electrical signal, microwave signal, terahertz signal, or light signal) sampling technique in which a light signal modulated with an electromagnetic signal that contains information of interest is projected over an array of photodetectors (e.g., elements that produce charge carriers when illuminated with light) and the resulting photo-induced charge is stored in the photodetector array in the form of photo-induced charge until read out or digitized, effectively forming a sample and hold circuit for the electronic signal. If the sampled and held values are digitized, the system forms a digitizer, also referred to as an analog-to-digital converter (ADC). The system can map time instants of the signal of interest first to wavelengths of a carrier light signal and then to unique spatial locations on a photodetector array. The wavelength to space mapping is based on using a wavelength dispersion system (e.g., a grating) designed to perform wavelength-based spatial spreading. Because the photodetectors each receive a separate time-instant of the signal, the sampling rate of the system can be expressed as N/t, where N is the quantity of photodetectors receiving unique wavelengths and t is the length (e.g., in units time) of the light pulse. The modulated light may be processed with optical or photonic devices before the light is incident on the photodetectors. In an embodiment, an image sensor, such as an off the shelf CMOS image sensor, is used as the photodetector array.

The current disclosure includes a sampling technique in which a light signal modulated with an electromagnetic signal that contains information of interest is projected over an array of photodetectors (elements that produce charge carriers when illuminated with light) and the resulting photo-induced charge is stored in the photodetector array in the form of photo-induced charge until read out or digitized, effectively forming a sample and hold circuit for the electronic signal. If the sampled and held values are digitized, the system forms a digitizer. Digitizer is also called an analog to digital converter (ADC). The system maps the time instants of the signal of interest first to wavelengths of the carrier light signal and then to unique spatial locations on the photodetector array. The wavelength to position mapping is based on using a projection device (e.g. grating) designed to perform this function. The fact that the photodetectors each receive a separate time-instant of the signal increases the sampling rate of the system to N/t, where N is the quantity of photodetectors receiving unique wavelengths and t is the length of the light pulse. The modulated light may be processed with optical or photonic devices before it enters the photodetectors.

As described herein, the input signal is an electromagnetic signal that may include, for example, an analog electrical signal, a digital electrical signal, a radio frequency (RF) electrical signal, a microwave electrical signal, a terahertz signal, or a light signal (e.g., electromagnetic signals in the optical spectrum). As used herein, the light signal, or optical signal, includes electromagnetic radiation from deep ultraviolet (UV) wavelengths all the way to millimeter waves. Some features disclosed herein are described below.

Item 1. A sampling technique for an electromagnetic signal (typically an analog electrical signal, but can also be a signal carried by light or other forms of electromagnetic radiation, also a digital signal) in which a light pulse or continuous light modulated with a signal that contains information of interest is projected or dispersed over an array of photodetectors (elements that produce charge carriers when illuminated with light) and the resulting photo-induced charges are stored in the photodetector array until read out or digitized, effectively forming a sample and hold circuit for the signal. The array can be one dimensional (1D) or 2 dimensional (2D).

Item 2. A sampling technique of item 1 used to effectively form a sample and hold circuit that has very high combined sampling rate due to the fact that the individual photodetectors receive different wavelengths of the light signal which carry different time instants of the signal of interest. The approach is analogous to a time-interleaved sample and hold circuit with potentially millions of individual sample and hold stages.

Item 3. Methods and systems for constructing an ultra-high sampling rate time interleaved sample and hold circuit using the techniques of items 1 and/or 2 and using a front-end system in which an electronic signal of interest is superimposed into a chirped and elongated light pulse with and electro-optical modulator. The front end uses wave velocity dispersion in optical fiber with a Mach-Zehnder optical modulator to perform a time-to-optical wavelength translation for an RF signal. Next, a spectrograph (projection device) performs a wavelength-to-position translation by dispersing the modulated optical signal. The overall result is an irradiance pattern at the spectrograph exit plane that corresponds to the time-dependence of the RF signal. The spectrograph exit plane will be the photodetector array input plane.

Item 4. Methods and systems for constructing a very high sampling rate digitizer (also called an analog to digital converter) that uses the techniques and systems of the items 1, 2, and/or 3 and digitizes the signal after sampling with an electronic ADC or ADCs. The benefits of this approach include: The methods and systems can form an extremely high sampling rate digitizer without the need of any high-speed electronics components; The methods and systems can provide the benefit of having very low jitter due to the facts that optical and photonic components in general have lower jitter than electronic components and also due to the fact that the operation does not need electronic clock signals the jitter of which could reduce signal to noise ratio (SNR); The methods and systems can provide the benefit that it can be optimized for very high SNR due to the high oversampling rate it provides for most signals.

Item 5. Methods and systems that use the techniques of the items 1, 2, 3, and/or 4 that can be calibrated using a laser source with well-known wavelength and/or using the photodetectors in the array that receive the same wavelengths as some other photodetectors in the system, e.g., utilizing the signal overlap.

Item 6. Methods and systems that use any combination of techniques mentioned in items 1, 2, 3, 4, and/or 5 and that uses a component off the shelves (COTS) image sensor or camera for the signal digitization and/or sampling. The potential usage of COTS components provides significant benefits in system costs.

Item 7. Methods and systems generating different wavelengths in a light pulse used in photonic assisted signal sampling and digitization systems with an active device, such as a tunable vertical-cavity surface-emitting laser (VCSEL), as compared to passive device techniques described in the prior art.

Item 8. Methods and systems for constructing a photonic assisted signal analyzer. In an embodiment, the methods and systems use the technique of claim 3 in which irradiance pattern at the spectrograph exit plane that corresponds to the time-dependence of the RF signal will be the input for the back end of the photonic signal analyzer. Then, the back end of the photonic signal analyzer uses optical Fourier transforming optics which translates the irradiance pattern at the spectrograph exit plane into an image, on a photodetector array, that represents the frequency components of the RF signal. In addition to providing frequency domain information, the significant reduction in the amount of data to be read out provides a very fast signal analysis system. This type of system can be also called an (photonic assisted) analog to information converter, or an (photonic assisted) analog to feature converter.

Item 9. Methods and systems using the feature as recited in item 8 and that has a frosted optical surface placed at the exit plane of the spectrograph which ensures sufficient overlap of the light from every point in the irradiance image on Fourier transforming optics.

Item 10. System utilizing the signal analyzer system in claim 8 as the basis of an ultra-wide-bandwidth spectral awareness receiver system. This type of system can be used to find even small amounts of spectral energy very quickly within a wide bandwidth, e.g. 100 GHz. After candidate signal bands have been found, then a more accurate system can be used to tune to these frequencies to fully characterize them.

Item 11. An apparatus comprising: transmissive, reflective or catadioptric element producing collimated light; a fine groove pitch (echellette) transmissive or reflective diffraction grating providing angular separation of wavelengths; an order-sorting filter (OSF) to eliminate any diffraction order overlapping; transmissive, reflective or catadioptric elements arranged to direct and focus light onto a 1D array of photodetectors.

Item 12. An apparatus, which may be used to implement the technique recited in item 1, comprising transmissive, reflective or catadioptric element producing collimated light; a coarse groove pitch (echelle) diffraction grating providing tens of overlapping diffraction orders in a single direction (example, X-direction) with angularly separated wavelengths; a transmissive or reflective fine-pitch (echellette) grating placed before or after the coarse-pitch (echelle) grating in a perpendicular manner as a means of cross-dispersing the overlapping orders to a secondary direction (example, Y-direction); transmissive, reflective or catadioptric elements arranged to direct and focus light onto a 2D array of photodetectors.

Item 13. An apparatus, which may be used to implement the technique recited in item 1, comprising: transmissive, reflective or catadioptric element producing collimated light; a coarse groove pitch (echelle) diffraction grating providing tens of overlapping diffraction orders in a single direction (example, X-direction) with angularly separated wavelengths; a highly dispersing prism placed before or after the coarse-pitch (echelle) grating in a perpendicular manner as a means of cross-dispersing the overlapping orders to a secondary direction (example, Y-direction); transmissive, reflective or catadioptric elements arranged to direct and focus light onto a 2D array of photodetectors.

Item 14. An apparatus, which may be used to implement the technique recited in item 1, comprising: transmissive, reflective or catadioptric element producing collimated light; a cylindrical element producing a line shape; a Virtually Imaged Phased Array (VIPA) providing very high wavelength dispersion and many overlapping diffraction orders in a single direction (example, X-direction); a fine groove-pitch (echelle) diffraction grating placed before or after VIPA in a perpendicular manner as a means of cross-dispersing the overlapping orders to a secondary direction (example, Y-direction); transmissive, reflective or catadioptric elements arranged to direct and focus light onto a 2D array of photodetectors.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A system comprising:
    a time-to-wavelength dispersion system configured to generate a wavelength dispersed optical pulse that is modulated according to an input signal;
    a wavelength-to-space dispersion system configured to spatially disperse the wavelength dispersed optical pulse by wavelength to produce a spatially dispersed optical pulse;
    a Fast Fourier Transform (FFT) optical system configured to transform the spatially dispersed optical pulse into a frequency domain transformed optical pulse;
    a sensor system configured to convert the frequency domain transformed optical pulse to electrical signals, the sensor system including a two-dimensional (2D) array of photodetectors; and
    a processor configured to determine frequency information about the input signal from the electrical signals.

2. The system of claim 1, further comprising a display for outputting the electrical signals as an image that conveys optical spectrum information.

3. The system of claim 1, wherein the processor is configured to decode the electrical signals from the sensor system in response to a wavelength-space mapping that corresponds to the spatial dispersion of the spatial dispersion system to determine the frequency information.

4. A method comprising:
    outputting a wavelength dispersed optical pulse that is modulated according to an input signal;
    spatially dispersing the wavelength dispersed optical pulse by wavelength to produce a spatially dispersed optical pulse;
    transforming the spatially dispersed optical pulse according to a Fast Fourier Transform (FFT) operation into a frequency domain transformed optical pulse; and
    converting the frequency domain transformed optical pulse to electrical signals at a sensor system, the sensor system including a two-dimensional (2D) array of photodetectors; and
    determining frequency information about the input signal from the electrical signals.

5. The method of claim 4, wherein determining the frequency information about the input signal involves decoding the electrical signals from the sensor system in response to a wavelength-space mapping that corresponds to the spatial dispersion of the spatial dispersion system.

6. The method of claim 4, further comprising decoding the electrical signals from the image sensor to spectrum information of the input signal.

7. The method of claim 4, further comprising outputting the electrical signals from the image sensor as an image.

8. The method of claim 4, wherein the input signal is an RF input signal.

* * * * *